(12) United States Patent
Daimon

(10) Patent No.: US 11,296,676 B2
(45) Date of Patent: Apr. 5, 2022

(54) MULTIPLEXER, HIGH-FREQUENCY FRONT-END CIRCUIT, AND COMMUNICATION DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 71 days.

(21) Appl. No.: 16/831,872

(22) Filed: Mar. 27, 2020

(65) Prior Publication Data

US 2020/0228093 A1 Jul. 16, 2020

Related U.S. Application Data

(63) Continuation of application No. PCT/JP2018/035557, filed on Sep. 26, 2018.

(30) Foreign Application Priority Data

Sep. 29, 2017 (JP) .............................. JP2017-192132

(51) Int. Cl.
*H03H 9/25* (2006.01)
*H03H 9/02* (2006.01)
(Continued)

(52) U.S. Cl.
CPC .......... *H03H 9/25* (2013.01); *H03H 9/02157* (2013.01); *H03H 9/02228* (2013.01);
(Continued)

(58) Field of Classification Search
CPC .. H03H 9/25; H03H 9/02157; H03H 9/02228; H03H 9/02275; H03H 9/14541;
(Continued)

(56) References Cited

U.S. PATENT DOCUMENTS

2013/0271238 A1   10/2013  Onda et al.
2016/0126932 A1*  5/2016  Nakai ................... H03H 9/6406
                                                                       370/277

(Continued)

FOREIGN PATENT DOCUMENTS

JP        2013-223025 A    10/2013
JP        2016-119569 A     6/2016
(Continued)

OTHER PUBLICATIONS

Official Communication issued in International Patent Application No. PCT/JP2018/035557, dated Dec. 4, 2018.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

A first filter of a multiplexer has a ladder filter structure defined by acoustic wave resonators. An imaginary line obtained by connecting second ends of electrode fingers included in one comb-shaped electrode among a pair of comb-shaped electrodes of each resonator intersects a reference line that is a straight line extending in an acoustic wave propagation direction. When an angle defined by the reference line and the imaginary line of a first series resonator is represented by a first slant angle, an angle defined by the reference line and the imaginary line of a parallel resonator is represented by a second slant angle, and an angle defined by the reference line and the imaginary line of acoustic wave resonators is represented by a third slant angle, at least one of the first slant angle and the second slant angle is smaller than the third slant angle.

20 Claims, 13 Drawing Sheets

(51) Int. Cl.
*H03H 9/145* (2006.01)
*H03H 9/64* (2006.01)
*H04B 1/04* (2006.01)

(52) U.S. Cl.
CPC .... *H03H 9/02275* (2013.01); *H03H 9/14541* (2013.01); *H03H 9/14547* (2013.01); *H03H 9/6406* (2013.01); *H03H 9/6483* (2013.01); *H04B 1/0458* (2013.01)

(58) Field of Classification Search
CPC ............ H03H 9/14547; H03H 9/6406; H03H 9/6483; H03H 9/0458; H03H 9/14594; H03H 9/725; H04B 1/0458; H04B 1/0057
USPC .......................................... 333/133, 193–196
See application file for complete search history.

(56) References Cited

U.S. PATENT DOCUMENTS

| | | |
|---|---|---|
| 2016/0182010 A1 | 6/2016 | Nakamura et al. |
| 2016/0261038 A1 | 9/2016 | Tanaka |
| 2016/0294361 A1 | 10/2016 | Yamane et al. |
| 2017/0244431 A1 | 8/2017 | Araki |
| 2018/0097508 A1 | 4/2018 | Iwamoto et al. |
| 2018/0102755 A1 | 4/2018 | Takamine |
| 2018/0123565 A1 | 5/2018 | Takamine |
| 2018/0212586 A1* | 7/2018 | Mimura ............. H03H 9/02559 |
| 2019/0123721 A1 | 4/2019 | Takamine |

FOREIGN PATENT DOCUMENTS

| | | |
|---|---|---|
| JP | 2017-152881 A | 8/2017 |
| WO | 2015/064238 A1 | 5/2015 |
| WO | 2015/098756 A1 | 7/2015 |
| WO | 2016/208236 A1 | 12/2016 |
| WO | 2016/208446 A1 | 12/2016 |
| WO | 2016/208677 A1 | 12/2016 |
| WO | 2018/003273 A1 | 1/2018 |

* cited by examiner

MULTIPLEXER, HIGH-FREQUENCY FRONT-END CIRCUIT, AND COMMUNICATION DEVICE

CROSS REFERENCE TO RELATED APPLICATIONS

This application claims the benefit of priority to Japanese Patent Application No. 2017-192132 filed on Sep. 29, 2017 and is a Continuation Application of PCT Application No. PCT/JP2018/035557 filed on Sep. 26, 2018. The entire contents of each application are hereby incorporated herein by reference.

BACKGROUND OF THE INVENTION

1. Field of the Invention

The present invention relates to a multiplexer provided with a filter including acoustic wave resonators, a high-frequency front-end circuit, and a communication device.

2. Description of the Related Art

In recent years, to support a plurality of frequency bands and a plurality of wireless schemes (for example, multiband and multimode) using a single terminal, multiplexers that separate (split) a high-frequency signal into individual frequency bands have been widely used in communication devices such as mobile phone terminals. As a filter used in such a multiplexer, a filter device including acoustic wave resonators has been proposed (see, for example, International Publication 2015/098756). In this filter device, IDT (InterDigital Transducer) electrodes of the acoustic wave resonators are arranged to be slanted relative to an acoustic wave propagation direction to suppress the transverse-mode ripple in the pass band of the filter.

However, the filter described in International Publication 2015/098756 in which IDT electrodes are arranged to be slanted has a problem in that a response at an upper edge of a stop band (region where the wave length of an acoustic wave is made constant due to the confinement of the acoustic wave in a grating) outside its pass band is likely to occur.

Such a stop band response is not characteristically problematic in the pass band of the filter. In a multi-filter configuration in which paths extending through a plurality of filters are interconnected, however, such a stop band response may affect the characteristics of another filter and cause deterioration. Specifically, if the frequency at which a stop band response has occurred lies in the pass band of another filter, the stop band response may cause an increase in the ripple in the pass band (pass band ripple) of the other filter.

SUMMARY OF THE INVENTION

Preferred embodiments of the present invention provide multiplexers, high-frequency front-end circuits, and communication devices in each of which a response at an upper edge of a stop band can be significantly reduced or prevented.

A multiplexer according to a preferred embodiment of the present invention includes a common terminal, a first terminal, and a second terminal; a first filter provided on a first path electrically connecting the common terminal and the first terminal, the first filter including a plurality of acoustic wave resonators; and a second filter provided on a second path electrically connecting the common terminal and the second terminal, the second filter having a pass band that is higher in frequency than the first filter. The plurality of acoustic wave resonators include two or more series resonators provided on the first path, and one or more parallel resonators each provided on a path electrically connecting a node on the first path and ground. A first series resonator that is closest to the common terminal among the two or more series resonators is electrically connected to the common terminal without the one or more parallel resonators therebetween. Each of the plurality of acoustic wave resonators includes an IDT electrode defined by a pair of comb-shaped electrodes provided on a substrate having piezoelectricity. Each of the pair of comb-shaped electrodes of each of the plurality of acoustic wave resonators includes a plurality of electrode fingers that extend in a direction perpendicular or substantially perpendicular to an acoustic wave propagation direction, and a busbar electrode that connects first ends of the plurality of electrode fingers to each other. An imaginary line obtained by connecting second ends of the plurality of electrode fingers included in one comb-shaped electrode among the pair of comb-shaped electrodes intersects a reference line that is a straight line extending in the acoustic wave propagation direction. When an angle defined by the reference line and the imaginary line of the first series resonator is represented by a first slant angle, an angle defined by the reference line and the imaginary line of a first parallel resonator that is closest to the common terminal among the one or more parallel resonators is represented by a second slant angle, and an angle defined by the reference line and the imaginary line of the rest of the plurality of acoustic wave resonators is represented by a third slant angle, at least one of the first slant angle and the second slant angle is smaller than the third slant angle.

As described above, IDT electrodes are arranged such that the imaginary line described above and the reference line described above intersect, that is, IDT electrodes are slanted relative to the acoustic wave propagation direction. This arrangement is able to significantly reduce or prevent generation of the transverse-mode ripple in each resonator. In addition, the IDT electrode of at least one of the series resonator that is the closest to the common terminal or the parallel resonator that is the closest to the common terminal is less slanted than the IDT electrodes of the rest of the plurality of other acoustic wave resonators. This arrangement is able to significantly reduce or prevent the stop band response of the resonator, which largely affects the second filter. Accordingly, it is possible to significantly reduce or prevent the response generated in the stop band of the first filter and to reduce the insertion loss in the pass band of the second filter.

Further, at least one of the first slant angle and the second slant angle may be less than or equal to about 2.5°.

Accordingly, it is possible to further significantly reduce or prevent the response generated in the stop band of the first filter.

Further, each of the first slant angle and the second slant angle may be smaller than the third slant angle.

As described above, setting each of the first slant angle and the second slant angle to be smaller than the third slant angle can significantly reduce or prevent the stop band response that affects the second filter. Accordingly, it is possible to significantly reduce or prevent the response generated in the stop band of the first filter and to reduce the insertion loss in the pass band of the second filter.

A multiplexer according to a preferred embodiment of the present invention includes a common terminal, a first terminal, and a second terminal; a first filter provided on a first path electrically connecting the common terminal and the first terminal, the first filter including a plurality of acoustic wave resonators; and a second filter provided on a second path electrically connecting the common terminal and the second terminal, the second filter having a pass band that is higher in frequency than the first filter. The plurality of acoustic wave resonators include one or more series resonators provided on the first path, and two or more parallel resonators provided on paths electrically connecting the first path and ground. The two or more parallel resonators include a first parallel resonator positioned on the common terminal side, and a parallel resonator positioned on the first terminal side, as viewed from a first series resonator that is closest to the common terminal among the one or more series resonators. Each of the plurality of acoustic wave resonators includes an IDT electrode defined by a pair of comb-shaped electrodes provided on a substrate having piezoelectricity. Each of the pair of comb-shaped electrodes of each of the plurality of acoustic wave resonators includes a plurality of electrode fingers that extend in a direction perpendicular or substantially perpendicular to an acoustic wave propagation direction, and a busbar electrode that connects first ends of the plurality of electrode fingers to each other. An imaginary line obtained by connecting second ends of the plurality of electrode fingers included in one comb-shaped electrode among the pair of comb-shaped electrodes intersects a reference line that is a straight line extending in the acoustic wave propagation direction. When an angle defined by the reference line and the imaginary line of the first parallel resonator is represented by a first slant angle, an angle defined by the reference line and the imaginary line of the first series resonator is represented by a second slant angle, and an angle defined by the reference line and the imaginary line of the rest of the plurality of acoustic wave resonators is represented by a third slant angle, at least one of the first slant angle and the second slant angle is smaller than the third slant angle.

As described above, IDT electrodes are arranged such that the imaginary line described above and the reference line described above intersect, that is, IDT electrodes are slanted. This arrangement is able to significantly reduce or prevent generation of the transverse-mode ripple in each resonator. In addition, the IDT electrode of at least one of the parallel resonator that is the closest to the common terminal or the series resonator that is the closest to the common terminal is less slanted than the IDT electrodes of the rest of the plurality of other acoustic wave resonators. This arrangement is able to significantly reduce or prevent the stop band response of the resonator, which largely affects the second filter. Accordingly, it is possible to significantly reduce or prevent the response generated in the stop band of the first filter and to reduce the insertion loss in the pass band of the second filter.

Further, at least one of the first slant angle and the second slant angle may be less than or equal to about 2.5°.

Accordingly, it is possible to further significantly reduce or prevent the response generated in the stop band of the first filter.

Further, each of the first slant angle and the second slant angle may be smaller than the third slant angle.

As described above, setting each of the first slant angle and the second slant angle to be smaller than the third slant angle can significantly reduce or prevent the stop band response that affects the second filter. Accordingly, it is possible to significantly reduce or prevent the response generated in the stop band of the first filter and to reduce the insertion loss in the pass band of the second filter.

Further, the substrate may include a piezoelectric layer including a principal surface on which the IDT electrodes are provided, a high-acoustic-velocity support substrate in which a bulk wave propagates at a higher acoustic velocity than an acoustic velocity of an acoustic wave that propagates in the piezoelectric layer, and a low-acoustic-velocity film that is located between the high-acoustic-velocity support substrate and the piezoelectric layer and in which a bulk wave propagates at a lower acoustic velocity than an acoustic velocity of a bulk wave that propagates in the piezoelectric layer.

Accordingly, the Q value of each resonator including an IDT electrode provided on a substrate including a piezoelectric layer is able to be maintained at a high value.

Further, a frequency of a stop band response generated by the first filter may be included in the frequency pass band of the second filter.

Accordingly, it is possible to reduce or prevent the response generated in the stop band of the first filter and to reduce the insertion loss in the pass band of the second filter.

Further, a high-frequency front-end circuit according to a preferred embodiment of the present invention includes a multiplexer according to a preferred embodiment of the present invention, and an amplifier circuit electrically connected to the multiplexer.

Accordingly, it is possible to provide a high-frequency front-end circuit in which the response generated in the stop band of the first filter can be significantly reduced or prevented and in which the insertion loss in the pass band of the second filter can be reduced.

Further, a communication device according to a preferred embodiment of the present invention includes an RF signal processing circuit that processes a high-frequency signal to be transmitted or received by an antenna element, and a high-frequency front-end circuit according to a preferred embodiment of the present invention, which transmits the high-frequency signal between the antenna element and the RF signal processing circuit.

Accordingly, preferred embodiments of the present invention provide a communication device in which the response generated in the stop band of the first filter can be significantly reduced or prevented and in which the insertion loss in the pass band of the second filter can be reduced.

In the multiplexers and the like according to the preferred embodiments the present invention, it is possible to significantly reduce or prevent the response generated in the stop band of a filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Background to Present Invention

Figure 1:
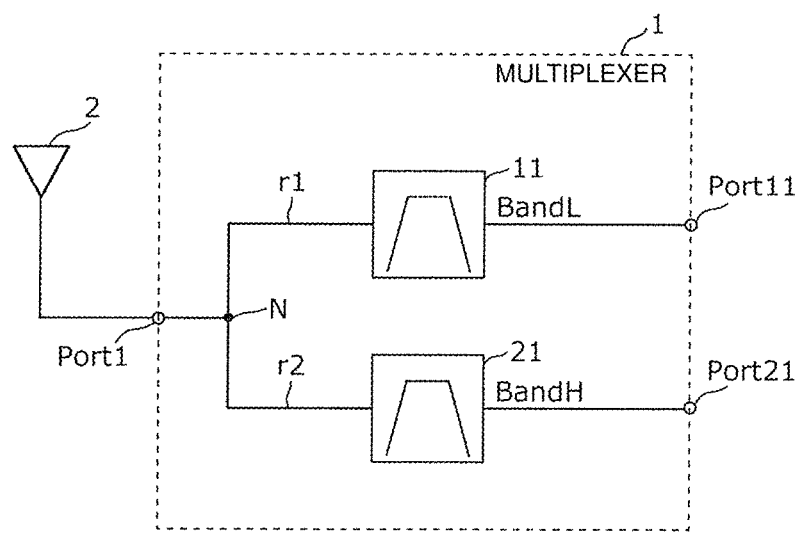
FIG. 1 is a diagram of a multiplexer common to preferred embodiments of the present invention and a comparative example.

First, the background to the present invention will be described with reference to FIG. 1 to FIG. 4. FIG. 1 is a diagram of a multiplexer 1, which is common to both preferred embodiments of the present invention and a comparative example. In FIG. 1, an antenna element 2 connected to a common terminal Port1 is also shown.

The multiplexer 1 includes the common terminal Port1, a first terminal Port11, a second terminal Port21, a first filter 11, and a second filter 21. The first filter 11 is provided on a first path r1 connecting the common terminal Port1 and the first terminal Port11. The second filter 21 is provided on a second path r2 connecting the common terminal Port1 and the second terminal Port21. The pass band of the second filter 21 is higher in frequency than that of the first filter 11.

Figure 2:
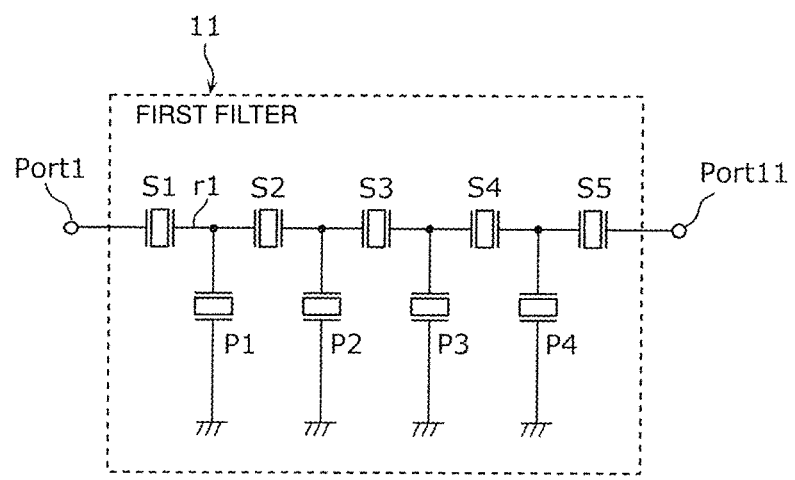
FIG. 2 is a circuit diagram showing a first filter of the multiplexer according to the comparative example.

FIG. 2 is a circuit diagram showing the first filter 11 of the multiplexer 1 according to the comparative example.

The first filter 11 according to the comparative example is a ladder filter including a plurality of acoustic wave resonators. The first filter 11 includes series resonators S1, S2, S3, S4, and S5, which are acoustic wave resonators provided on the first path r1, and parallel resonators P1, P2, P3, and P4, which are acoustic wave resonators provided on paths connecting the first path r1 and ground. The series resonators S1 to S5 are provided in the stated order from the common terminal Port1 toward the first terminal Port11. The parallel resonator P1 is connected between the series resonators S1 and S2, the parallel resonator P2 is connected between the series resonators S2 and S3, the parallel resonator P3 is connected between the series resonators S3 and S4, and the parallel resonator P4 is connected between the series resonators S4 and S5. All or some of the series resonators S1 to S5 and the parallel resonators P1 to P4 are hereinafter sometimes referred to as "resonators".

Figure 3:
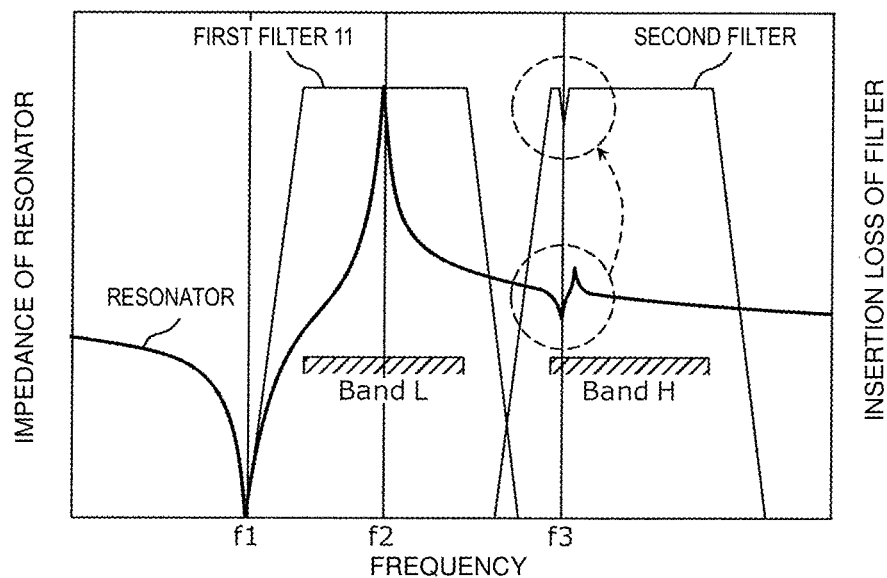
FIG. 3 is a diagram showing a response generated in the stop band of the first filter according to the comparative example.

A problem that can occur in the multiplexer 1 according to the comparative example will be described with reference to FIG. 3. FIG. 3 is a diagram showing a response generated in the stop band of the first filter 11 according to the comparative example. In FIG. 3, the thick line in the graph indicates an impedance characteristic of the series resonator S1 having a resonant frequency f1 and an anti-resonant frequency f2, and the thin line in the graph indicates the insertion loss of the first filter 11 and the insertion loss of the second filter 21.

A stop band response is a spurious response resulting from a reflector of a resonator. At frequencies higher than an anti-resonance point of the resonator, the stop band response appears as, for example, a ripple-shaped impedance disturbance. As shown in FIG. 3, if a stop band response caused by any resonator of the first filter 11 occurs at a frequency f3, a portion of a signal of the frequency f3 to be reflected by the first filter 11 is not reflected and is lost, and a pass band ripple appears in the second filter 21. The pass band ripple causes insertion loss in the pass band of the second filter 21. To reduce the insertion loss of the second filter 21, the stop band response caused by a resonator of the first filter 11 is significantly reduced or prevented.

As described above, by providing IDT electrodes of resonators that are slanted relative to the acoustic wave propagation direction, the transverse-mode ripple in the pass band of the first filter is able to be significantly reduced or prevented. However, when IDT electrodes are slanted, reflectors insufficiently reflect a high-frequency signal, and a stop band response is likely to occur. Accordingly, it is a challenge to significantly reduce or prevent the stop band response as much as possible while slanting IDT electrodes so as to significantly reduce or prevent the transverse-mode ripple.

A description will now be provided of, among the plurality of resonators included in the first filter 11, a resonator whose stop band response more largely affects the second filter 21, that is, a resonator whose stop band response is significantly reduced or prevented to effectively reduce the insertion loss of the second filter 21.

Figure 4:
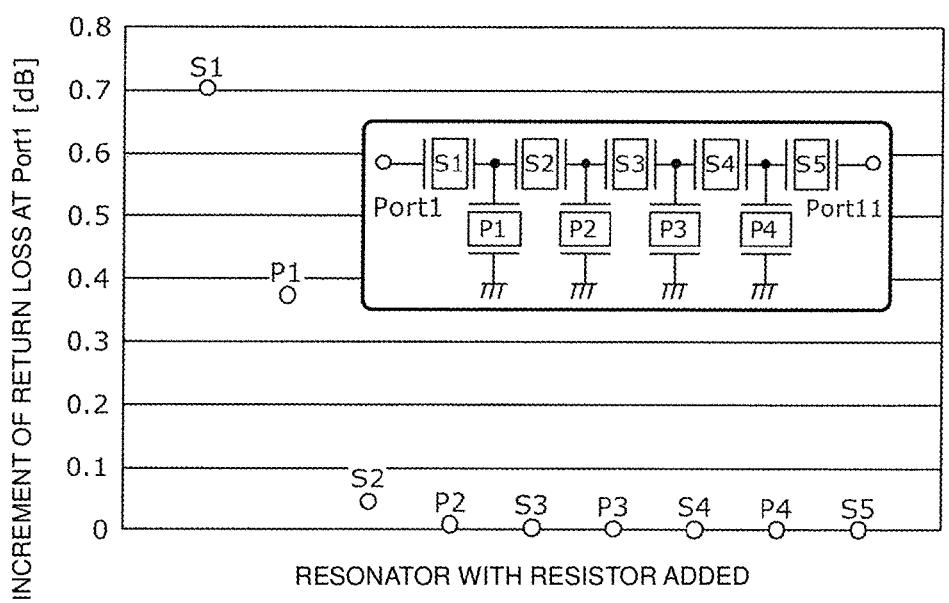
FIG. 4 is a diagram describing the return loss of the first filter in the comparative example.

FIG. 4 is a diagram describing the return loss of the first filter 11 in the comparative example. FIG. 4 is a diagram showing an increment of return loss obtained when a predetermined frequency signal is input to the first filter 11 in which a resistor is added to one of the plurality of resonators, compared with the return loss obtained when a predetermined frequency signal is input to the first filter 11 from the common terminal Port1 side. The predetermined frequency signal to be input to the first filter 11 is a signal including a frequency that lies in the stop band of the first filter 11 and that lies in the pass band of the second filter 21.

The addition of a resistor to a resonator simulates the generation of a stop band response in the resonator. The return loss of the first filter 11 increases by different amounts in accordance with the resonator to which a resistor is added, that is, the resonator in which a stop band response is generated.

The return loss is the reflection loss of the first filter 11 seen from the common terminal Port1. The greater the return loss, the smaller the reflection of a signal by the first filter 11. That is, a frequency signal in the pass band of the second filter 21 is absorbed by the first filter 11, and the insertion loss of the second filter 21 increases.

As shown in FIG. 4, the increment of return loss is at most about 0.7 dB when a resistor is added to the series resonator S1, which is the closest to the common terminal Port1, and the increment of return loss is at most about 0.38 dB when a resistor is added to the second closest parallel resonator P1. In contrast, the increment of return loss is at most about 0.05 dB when a resistor is added to the third closest series resonator S2, and the increment of return loss is approximately 0 dB when a resistor is added to each of the fourth and subsequent closest resonators P2 to P4 and S3 to S5, in which case the return loss is regarded as substantially not increasing. As described above, the increase in the return loss of the first filter 11 is larger when a stop band response is generated in a resonator positioned closer to the common terminal Port1, more specifically, the series resonator and the parallel resonator in the initial stage on the common terminal Port1 side. Accordingly, to reduce the insertion loss of the second filter 21, it is effective to take measures to reduce or prevent the stop band response for the series resonator and the parallel resonator in the initial stage on the common terminal Port1 side.

In the multiplexer 1, while each of the resonators included in the first filter 11 includes a structure that significantly reduces or prevents a transverse-mode ripple, a resonator positioned close to the common terminal Port1 includes a structure that significantly reduces or prevents a stop band response. This can reduce the insertion loss in the pass band of the second filter 21.

The following describes preferred embodiments of the present invention in detail with reference to examples and the drawings. All of the preferred embodiments described below provide general or specific examples. The values, shapes, materials, components, the arrangements and connection configurations of the components, and the like, which are provided in the following preferred embodiments, are examples and are not intended to limit the present invention. The components mentioned in the following preferred embodiments are described as optional components unless they are specified in the independent claims. In addition, the components shown in the drawings are not representative of exact proportions or dimensions. Additionally, in the drawings, the same or substantially the same structural elements are denoted by the same reference numerals, and any redundant description will be omitted or may be briefly provided. In the following preferred embodiments, the term "connected" includes directly connected and electrically connected via any other element and the like.

Preferred Embodiment 1

The multiplexer 1 according to Preferred Embodiment 1 of the present invention will be described with reference to FIG. 1 and FIG. 5 to FIG. 10. Some components are redundant in Preferred Embodiment 1 and the comparative example described above, and such redundant components will also be described again in Preferred Embodiment 1.

1-1. Configuration of Multiplexer

The multiplexer 1 of Preferred Embodiment 1 is a multiplexer (splitter) including a plurality of filters having different pass bands, in which antenna-side terminals of the plurality of filters are connected together to a common terminal Port1. Specifically, as shown in FIG. 1, the multiplexer 1 includes the common terminal Port1, a first terminal Port11, a second terminal Port21, a first filter 11, and a second filter 21.

The common terminal Port1 is common to the first filter 11 and the second filter 21 and is connected to the first filter 11 and the second filter 21 within the multiplexer 1. Further, the common terminal Port1 is connected to an antenna element 2 outside the multiplexer 1. That is, the common terminal Port1 is also an antenna terminal of the multiplexer 1.

The first terminal Port11 is connected to the first filter 11 within the multiplexer 1. The second terminal Port21 is connected to the second filter 21 within the multiplexer 1. The first terminal Port11 and the second terminal Port21 are connected to an RF signal processing circuit (RFIC: Radio Frequency Integrated Circuit, not shown) outside the multiplexer 1 via an amplifier circuit or the like (not shown).

The first filter 11 is provided on a first path r1 connecting the common terminal Port1 and the first terminal Port11. The first filter 11 is a receive filter whose pass band is, for example, the downlink frequency band (receive band) in Band L (low band).

The second filter 21 is provided on a second path r2 connecting the common terminal Port1 and the second terminal Port21. The second filter 21 is a receive filter whose pass band is, for example, the downlink frequency band (receive band) in Band H (high band).

The preferred characteristics for the first filter 11 and the second filter 21 are that the frequency bands (receive band or transmit band) in their corresponding Bands are passed, while the other bands are attenuated. In Preferred Embodiment 1, the second filter 21 is set to have a frequency pass band higher than the first filter 11.

The first path r1 and the second path r2 are connected to each other at a node N. That is, the node N is a point at which the first path r1 and the second path r2 are connected together. In the multiplexer 1, an impedance element, for example, an inductor for impedance matching, may be connected to the first path r1 connecting the first filter 11 and the node N and to the second path r2 connecting the second filter 21 and the node N, or to a path connecting the node N and the common terminal Port1, for example.

1-2. Configuration of Filter]

Next, the configuration of the first filter 11 and the second filter 21 will be described taking as an example the first filter 11 whose pass band is the Band L.

Figure 5:
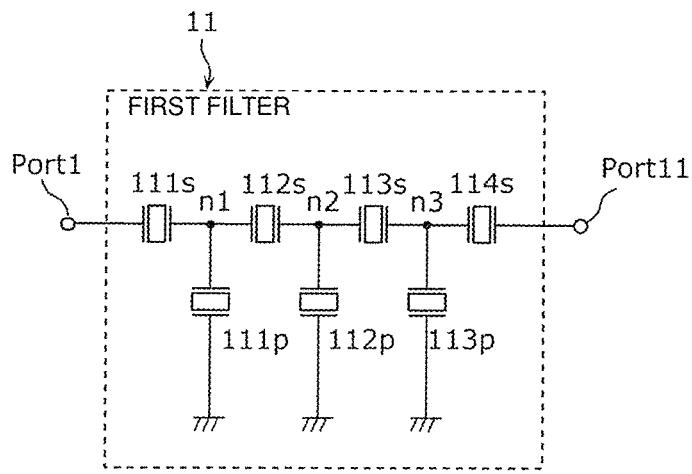
FIG. 5 is a circuit diagram showing a first filter of the multiplexer according to Preferred Embodiment 1 of the present invention.

FIG. 5 is a circuit diagram showing the first filter 11. As shown in FIG. 5, the first filter 11 includes acoustic wave resonators, namely, series resonators 111s, 112s, 113s, and 114s and parallel resonators 111p, 112p, and 113p. All or some of the series resonators 111s to 114s and the parallel resonators 111p to 113p are hereinafter sometimes referred to as "resonators 110".

The series resonators 111s to 114s are connected in series with each other along the first path (series arm) r1 connecting the common terminal Port1 and the first terminal Port11 in the stated order from the common terminal Port1 side. The parallel resonators 111p to 113p are provided on paths (parallel arms) connecting nodes n1, n2, and n3, each of which lies between adjacent ones of the series resonators 111s to 114s along the first path r1, and a reference terminal (ground). Accordingly, the parallel resonators 111p to 113p are connected in parallel to each other. Specifically, the series resonator (first series resonator) 111s, which is the closest to the common terminal Port1, is connected to the common terminal Port1 without the parallel resonators 111p to 113p therebetween. The parallel resonator that is the closest to the common terminal Port1 among the parallel resonators 111p to 113p is the parallel resonator (first parallel resonator) 111p. A first end of each of the parallel resonators 111p to 113p is connected to any one of the nodes n1, n2, and n3, and a second end thereof is connected to the reference terminal.

As described above, the first filter 11 has a T-type ladder filter structure defined by two or more series resonators (in Preferred Embodiment 1, four series resonators, for example) provided on the first path r1 and one or more parallel resonators (in Preferred Embodiment 1, three parallel resonators, for example) each provided on a path connecting the first path r1 and the reference terminal (ground).

The number of series resonators and the number of parallel resonators of the first filter 11 are not limited to four and three, respectively, and the first filter 11 may include two or more series resonators and one or more parallel resonators. The parallel resonator(s) may be connected to the reference terminal via an inductor. Further, an impedance element, for example, at least one of an inductor and a capacitor, may be added or connected to a series arm or a parallel arm. While the parallel resonators are connected to individual reference terminals in FIG. 5, individual reference terminals or a shared reference terminal may be selected in accordance with, for example, the constraints of the mounting layout of the first filter 11.

1-3. Structure of Acoustic Wave Resonator

Next, the basic structure of the resonators 110 defining the first filter 11 will be described. The resonators 110 in Preferred Embodiment 1 are preferably surface acoustic wave (SAW) resonators, for example.

The other filter, that is, the second filter 21, may not have the features described above and may be designed in accordance with predetermined filter characteristics and the like. Specifically, the second filter 21 may not have a ladder filter structure, and may have, for example, a longitudinally-coupled filter structure. Each of the resonators defining the second filter 21 is not limited to a SAW resonator and may be a BAW (Bulk Acoustic Wave) resonator, for example. Alternatively, the second filter 21 may be provided without resonators and may be a LC resonant filter or a dielectric filter, for example.

Figure 6:
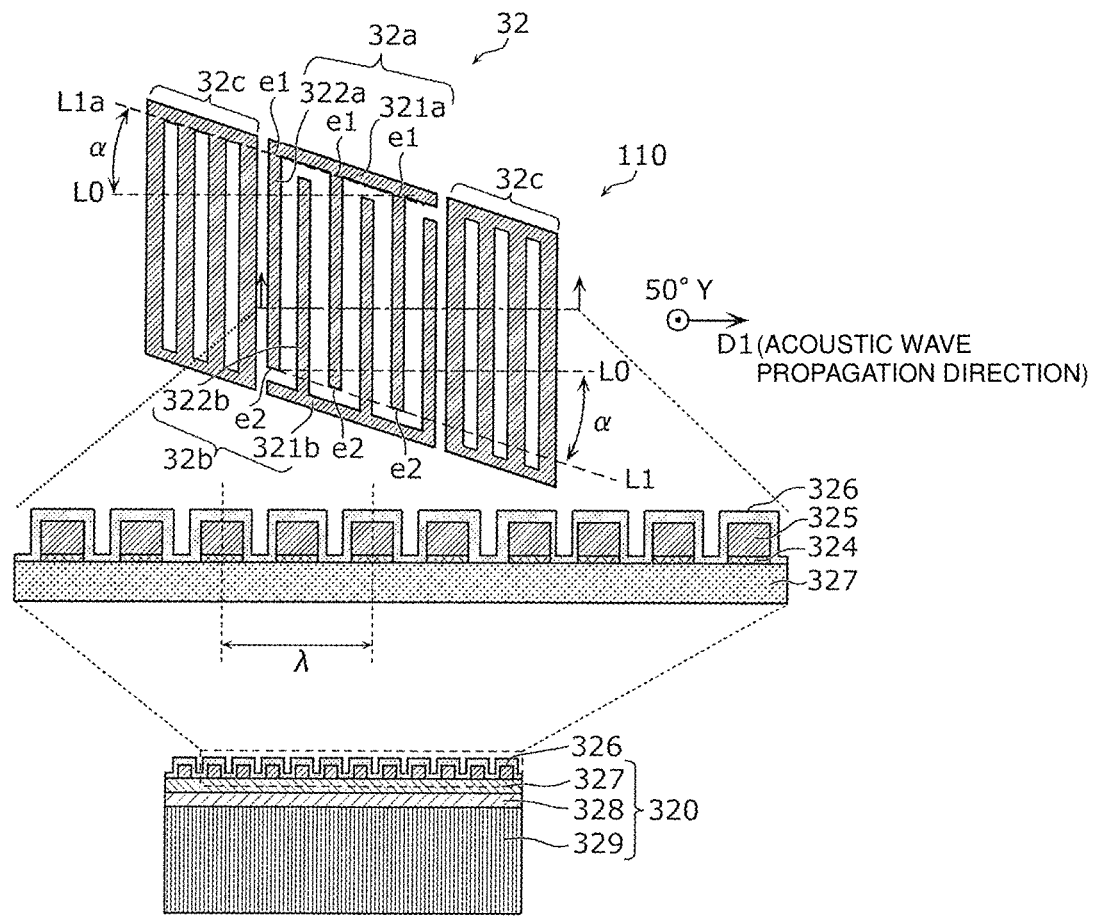
FIG. 6 includes a plan view and a cross-sectional view showing an acoustic wave resonator of the first filter according to Preferred Embodiment 1 of the present invention.

FIG. 6 includes a plan view and a cross-sectional view showing each of the resonators 110 of the first filter 11. The resonator 110 shown in FIG. 6 shows a typical structure of the resonator 110 described above, and the number and length of electrode fingers defining each electrode are not limited to the shown ones.

As shown in the plan view in FIG. 6, the resonator 110 includes a pair of opposing comb-shaped electrodes 32a and 32b, and reflectors 32c arranged relative to the pair of comb-shaped electrodes 32a and 32b in an acoustic wave propagation direction D1. The pair of comb-shaped electrodes 32a and 32b form an IDT electrode 32.

The comb-shaped electrode 32a is defined by a plurality of parallel electrode fingers 322a arranged in comb rows, and a busbar electrode 321a that connects first ends e1 of the plurality of electrode fingers 322a to each other. The comb-shaped electrode 32b is defined by a plurality of parallel electrode fingers 322b arranged in comb rows, and a busbar electrode 321b that connects first ends of the plurality of electrode fingers 322b to each other. The pluralities of electrode fingers 322a and 322b extend in a direction perpendicular or substantially perpendicular to the acoustic wave propagation direction D1.

The reflectors 32c, which are paired with each other, are arranged relative to the pair of comb-shaped electrodes 32a and 32b in the acoustic wave propagation direction D1. Specifically, the pair of comb-shaped electrodes 32a and 32b are disposed between the pair of reflectors 32c in the acoustic wave propagation direction D1. Each of the reflectors 32c is defined by a plurality of parallel reflection electrode fingers and reflector busbar electrodes that connect the plurality of reflection electrode fingers to each other. In the pair of reflectors 32c, the reflector busbar electrodes extend in the acoustic wave propagation direction D1.

An imaginary line L1 obtained by connecting second ends e2 of the plurality of electrode fingers 322a (ends of the plurality of electrode fingers 322a that are not connected to the busbar electrode 321a) to each other intersects a reference line L0, which is a straight line extending in the acoustic wave propagation direction D1, at a slant angle α, which is a predetermined angle. Further, an imaginary line L1a obtained by connecting the first ends e1 of the plurality of electrode fingers 322a (ends of the plurality of electrode fingers 322a that are connected to the busbar electrode 321a) to each other is parallel to the imaginary line L1 and intersects the reference line L0 at the slant angle α. An imaginary line obtained by connecting second ends of the plurality of electrode fingers 322b to each other and an imaginary line obtained by connecting the first ends of the plurality of electrode fingers 322b to each other also intersect the reference line L0 at the slant angle α. The individual IDT electrodes 32 defining the resonators 110 are slanted IDTs in which the acoustic wave propagation direction D1 intersects the direction in which the pluralities of electrode fingers 322a and 322b are provided.

In a one-port resonator that uses a surface acoustic wave, the transverse-mode ripple is generated between the resonant frequency and the anti-resonant frequency and may deteriorate the transmission characteristics in the pass band. To address the deterioration, the first filter 11 according to Preferred Embodiment 1 includes a slanted IDT as the IDT electrode 32 of each resonator. In the first filter 11 according to Preferred Embodiment 1, furthermore, each of the resonators 110 has a structure described below to significantly reduce or prevent the stop band response described above.

Figure 7A:
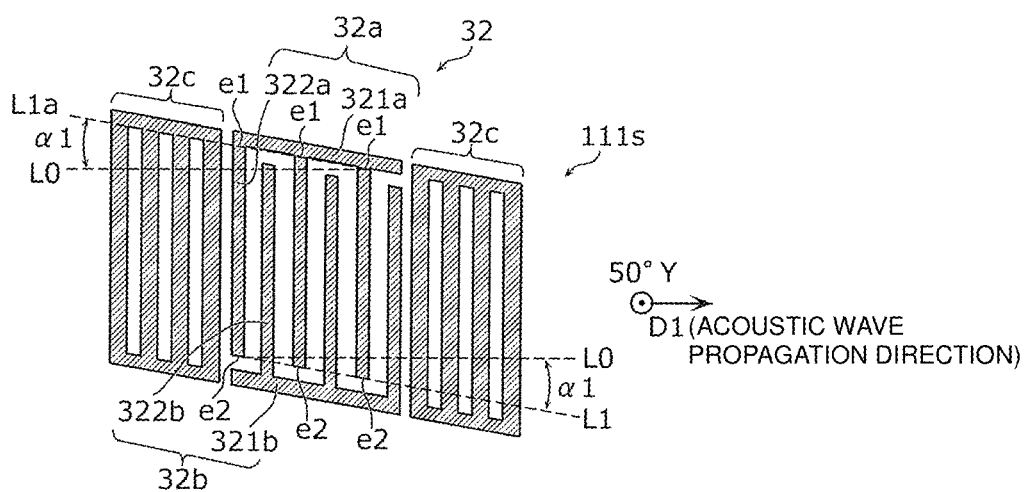
FIG. 7A is a plan view of a series resonator that is the closest to a common terminal in the first filter of Preferred Embodiment 1 of the present invention.
Figure 7B:
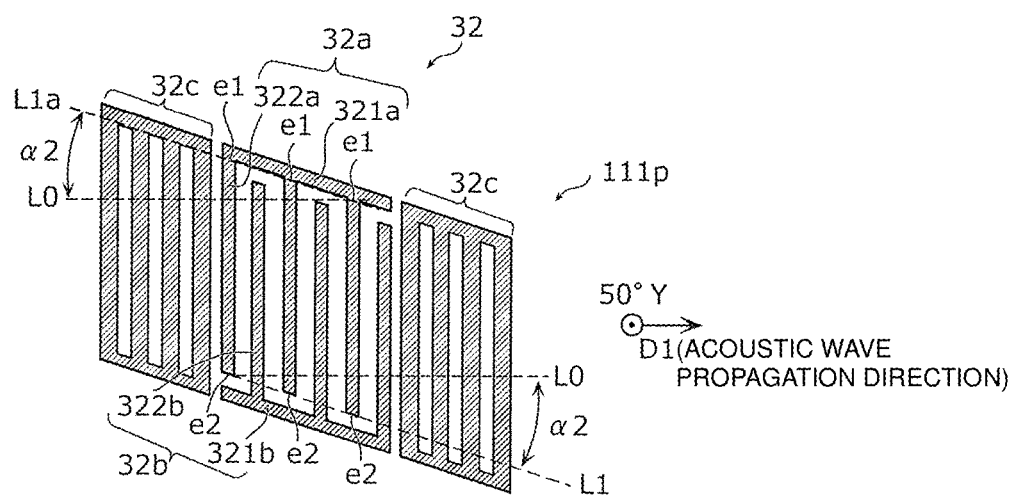
FIG. 7B is a plan view of a parallel resonator that is the closest to the common terminal in the first filter of Preferred Embodiment 1 of the present invention.
Figure 7C:
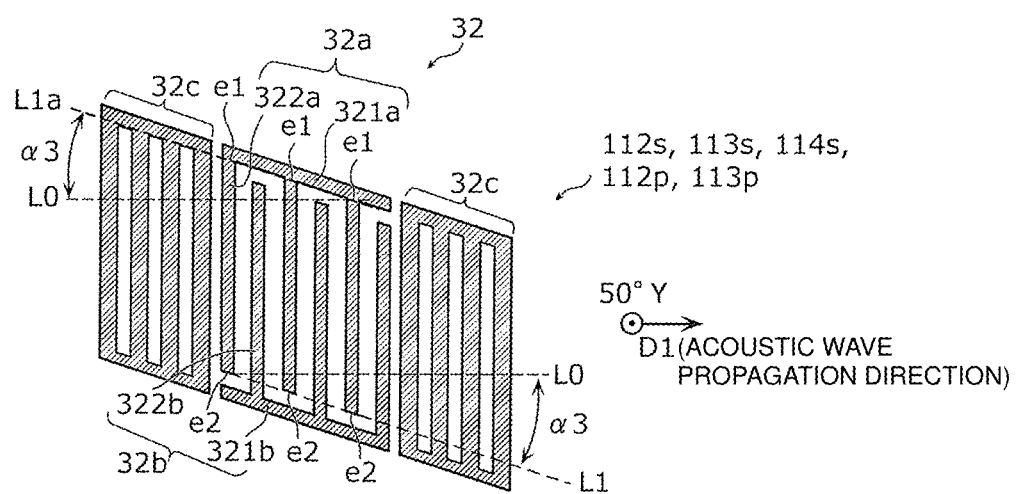
FIG. 7C is a plan view of the other acoustic wave resonators in the first filter of Preferred Embodiment 1 of the present invention.

FIG. 7A is a plan view showing the series resonator 111s, which is the closest to the common terminal Port1 in the first filter 11. FIG. 7B is a plan view showing the parallel resonator 111p, which is the closest to the common terminal Port1 in the first filter 11. FIG. 7C is a plan view showing the other acoustic wave resonators 112s to 114s, 112p, and 113p, different from the series resonator 111s and the parallel resonator 111p, in the first filter 11.

As shown in FIGS. 7A and 7B, in the first filter 11, the series resonator 111s and the parallel resonator 111p have different slant angles. As shown in FIGS. 7A and 7C, in the first filter 11, the series resonator 111s has a different slant angle from the other acoustic wave resonators 112s to 114s, 112p, and 113p.

Specifically, as shown in FIG. 7A, the angle defined by the reference line L0 and the imaginary line L1 of the series resonator 111s is represented by a first slant angle α1, as shown in FIG. 7B, the angle defined by the reference line L0 and the imaginary line L1 of the parallel resonator 111p is represented by a second slant angle α2, and, as shown in FIG. 7C, the angle defined by the reference line L0 and the imaginary line L1 of each of the acoustic wave resonators 112s to 114s, 112p, and 113p is represented by a third slant angle α3. In this case, the relationship of the first slant angle α1<the second slant angle α2 and the first slant angle α1<the third slant angle α3 is satisfied. The first slant angle α1 is selected as appropriate preferably from within a range greater than 0° and less than or equal to about 2.5°, for example. The resonators 110 defining the first filter 11 have the features described above, thus significantly reducing or preventing the response in the stop band of the first filter 11 while significantly reducing or preventing generation of the transverse-mode ripple.

The respective third slant angles α3 of the acoustic wave resonators 112s to 114s, 112p, and 113p may be the same or different.

1-4. Cross-Sectional Structure of Acoustic Wave Resonator

Referring back to FIG. 6, the cross-sectional structure of each of the resonators 110 will be described.

As shown in the cross-sectional view in FIG. 6, the IDT electrode 32, which is defined by the pluralities of electrode fingers 322a and 322b and the busbar electrodes 321a and 321b, has a multilayer structure including a close-contact layer 324 and a main electrode layer 325. The cross-sectional structure of the reflectors 32c is similar to the cross-sectional structure of the IDT electrode 32 and will not be described hereinafter.

The close-contact layer 324 enhances close contact between a piezoelectric layer 327 and the main electrode layer 325 and is preferably made of Ti, for example. The close-contact layer 324 preferably has a film thickness of, for example, about 12 nm.

The main electrode layer 325 is preferably made of, for example, Al including about 1% Cu. The main electrode layer 325 preferably has a film thickness of, for example, about 162 nm.

A protection layer 326 is provided on an outer surface of the IDT electrode 32 and a substrate 320, and the protection layer 326 covers the IDT electrode 32 and the substrate 320. The protection layer 326 protects the main electrode layer 325 from the external environment, adjusts the frequency-temperature characteristic, improves moisture resistance, and other purposes and is preferably made of, for example, silicon dioxide as a main component. The protection layer 326 preferably has a film thickness of, for example, about 25 nm.

The IDT electrode 32 and the reflectors 32c having the features described above are provided on a principal surface of the substrate 320 described below. The following describes a multilayer structure of the substrate 320 in Preferred Embodiment 1.

As shown in the bottom portion of FIG. 6, the substrate 320 has a structure including a high-acoustic-velocity support substrate 329, a low-acoustic-velocity film 328, and the piezoelectric layer 327. Accordingly, the high-acoustic-velocity support substrate 329, the low-acoustic-velocity film 328, and the piezoelectric layer 327 are stacked on one another in the stated order.

The piezoelectric layer 327 is a piezoelectric film having the IDT electrode 32 and the reflectors 32c provided on a principal surface thereof. The piezoelectric layer 327 is preferably made of, for example, a 50° Y-cut X-propagation LiTaO₃ piezoelectric single crystal or piezoelectric ceramics (lithium tantalate single crystal cut along a plane whose normal lies along the axis rotated by 50° from the Y axis about the X axis or ceramics, with surface acoustic waves propagating through the single crystal or ceramics along the X axis). The thickness of the piezoelectric layer 327 is preferably less than or equal to about 3.5λ, for example, where λ denotes the wave length of an acoustic wave determined by the electrode pitch of the IDT electrode 32, and is, for example, about 600 nm.

The high-acoustic-velocity support substrate 329 supports the low-acoustic-velocity film 328, the piezoelectric layer 327, and the IDT electrode 32. The acoustic velocity of a bulk wave in the high-acoustic-velocity support substrate 329 is higher than that of a surface acoustic wave or a boundary acoustic wave propagating in the piezoelectric layer 327, and confines a surface acoustic wave in a portion where the piezoelectric layer 327 and the low-acoustic-velocity film 328 are stacked on each other and not to permit leakage downward from the high-acoustic-velocity support substrate 329. The high-acoustic-velocity support substrate 329 is preferably, for example, a silicon substrate having a thickness of, for example, about 125 μm.

The acoustic velocity of a bulk wave in the low-acoustic-velocity film 328 is lower than the acoustic velocity of a bulk wave propagating in the piezoelectric layer 327. The low-acoustic-velocity film 328 is located between the piezoelectric layer 327 and the high-acoustic-velocity support substrate 329. Due to this structure and the intrinsic properties of an acoustic wave whose energy is concentrated in a low-acoustic-velocity medium, surface acoustic wave energy is significantly reduced or prevented from leaking outside the IDT electrode 32. The low-acoustic-velocity film 328 is a film preferably including, for example, silicon dioxide as a main component. The thickness of the low-acoustic-velocity film 328 is preferably less than or equal to about 2λ, for example, where λ denotes the wave length of an acoustic wave determined by the electrode pitch of the IDT electrode 32, and is, for example, about 670 nm.

In the multilayer structure of the substrate 320 in Preferred Embodiment 1, the Q values at the resonant frequency and the anti-resonant frequency can be significantly increased compared with the structure of the related art in which, for example, a piezoelectric substrate is provided as a single layer. In the multilayer structure described above, however, due to the high efficiency of confinement of acoustic wave energy in the thickness direction of the substrate 320, the stop band response generated by the resonator 110 is less likely to attenuate and remains. In the resonator 110 of Preferred Embodiment 1 having the multilayer structure described above, therefore, the stop band response is further significantly reduced or prevented. In Preferred Embodiment 1, as described above, the series resonator 111s, which is the closest to the common terminal Port1, has a smaller slant angle than the other acoustic wave resonators 112s to 114s and 111p to 113p, different from the series resonator 111s, and the stop band response of the first filter 11 can be significantly reduced or prevented.

1-5. Advantageous Effects, etc.

Figure 8:
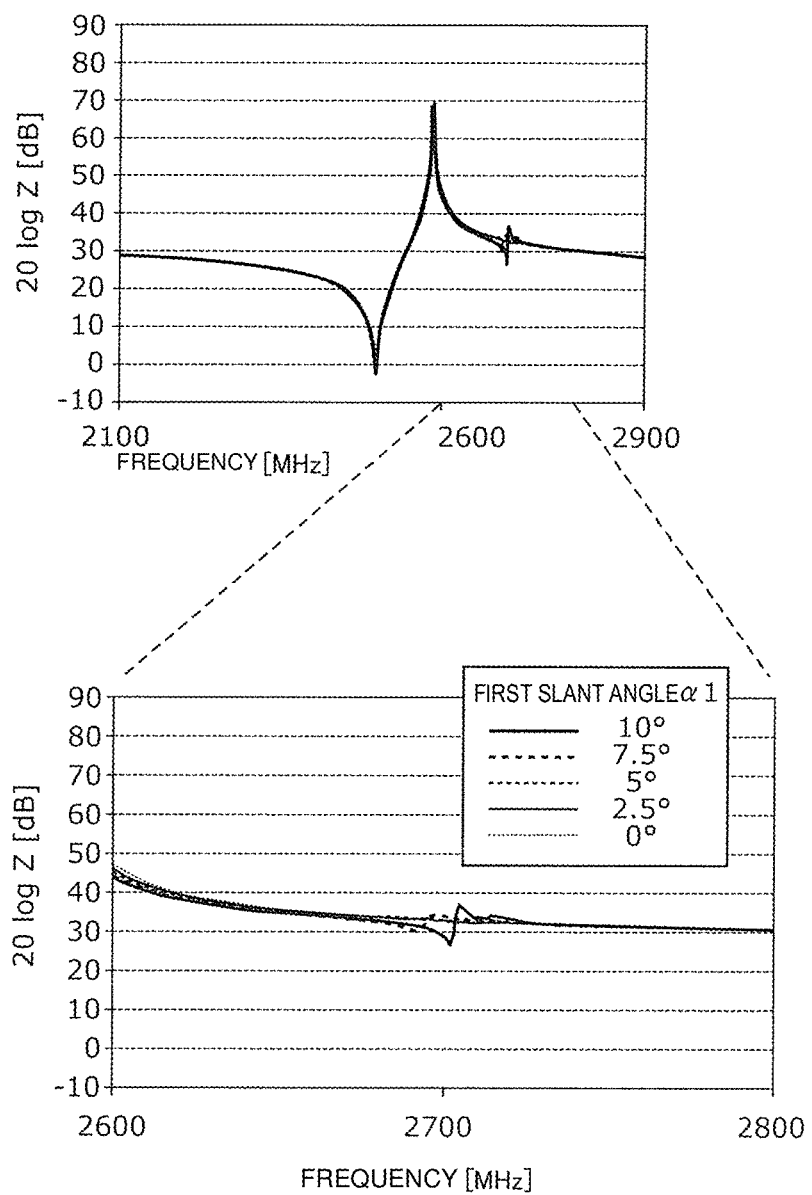
FIG. 8 is a diagram showing a change in the impedance of the acoustic wave resonator according to Preferred Embodiment 1 of the present invention.

FIG. 8 is a diagram showing a change in the impedance of the acoustic wave resonator 110 according to Preferred Embodiment 1. Specifically, FIG. 8 is a diagram showing the relationships between frequency and impedance when the first slant angle α1 of the series resonator 111s changes.

As shown in FIG. 8, in the series resonator 111s, an impedance disturbance occurs at a frequency of about 2700 MHz, which is in the stop band of the first filter 11, and a stop band response appears. When observed for increments of the first slant angle α1, the impedance disturbance is large when the first slant angle α1 is equal to about 10°, with the impedance disturbance decreasing as the first slant angle α1 decreases stepwise, for example, about 7.5°, about 5°, about 2.5°, and about 0°. For example, when the first slant angle α1 is equal to or less than about 2.5°, the impedance disturbance in the stop band of the first filter 11 is small, and substantially no stop band response appears.

Figure 9:
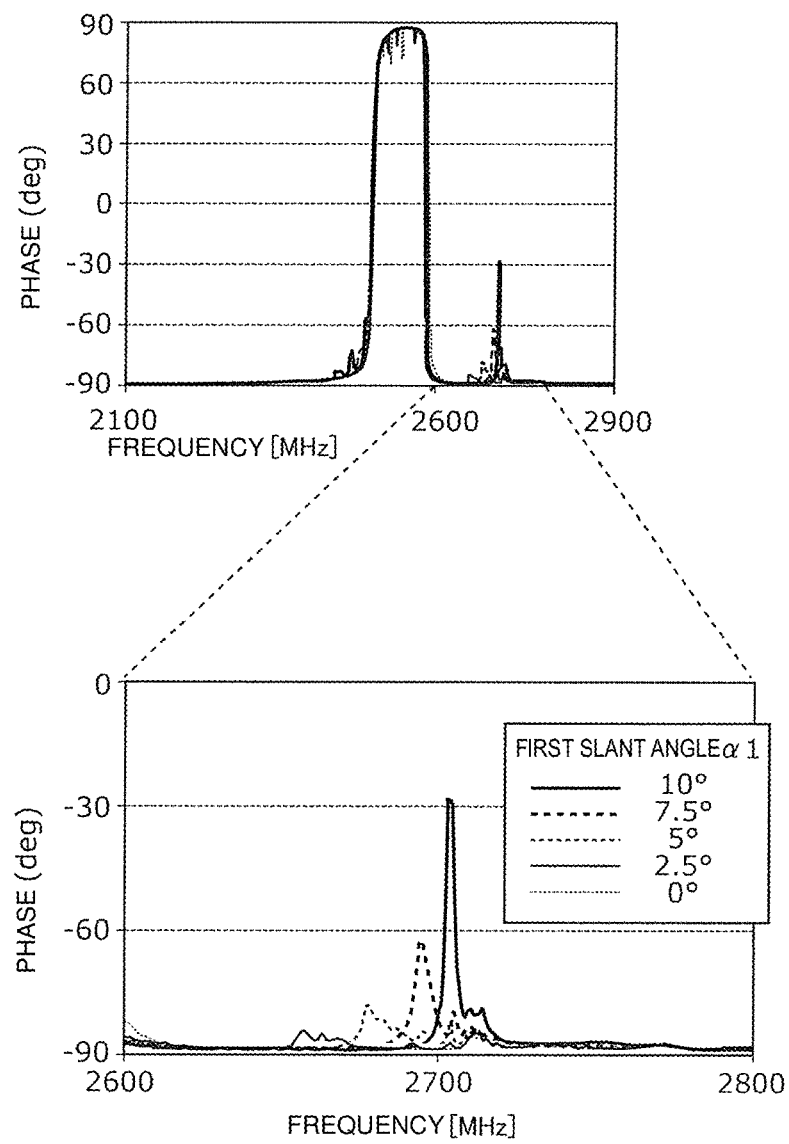
FIG. 9 is a diagram showing the relationships between frequency and phase for the acoustic wave resonator according to Preferred Embodiment 1 of the present invention.

FIG. 9 is a diagram showing the relationships between frequency and phase for the acoustic wave resonator 110, in which the impedance shown in FIG. 8 is converted into the phase using the S parameter. In the impedance-to-phase conversion, differences in stop band response when the first slant angle α1 changes appear markedly as differences in phase.

As shown in FIG. 9, in the series resonator 111s, the phase increases in the stop band of the first filter 11, and a stop band response appears. When observed for increments of the first slant angle α1, the phase is large when the first slant angle α1 is equal to about 10°, with the phase decreasing as the first slant angle α1 decreases stepwise. For example, when the first slant angle α1 is equal to or less than about 2.5°, the phase in the stop band of the first filter 11 is small, and substantially no stop band response appears.

Figure 10:
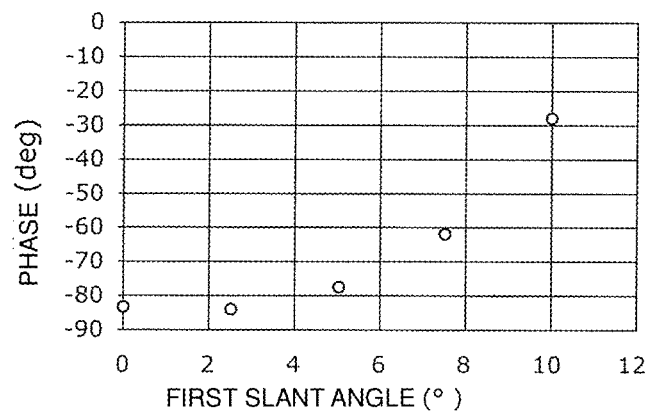
FIG. 10 is a diagram showing the relationship between a first slant angle of the acoustic wave resonator according to Preferred Embodiment 1 of the present invention and the phase.

FIG. 10 is a diagram showing the relationship between the first slant angle α1 of the acoustic wave resonator 110 and the phase. Specifically, in FIG. 10, the maximum value of the phase is plotted for increments of the first slant angle α1 on a graph whose horizontal axis represents the first slant angle α1 of the series resonator 111s shown in FIG. 9 and whose vertical axis represents phase.

As shown in FIG. 10, in the series resonator 111s, the phase is large when the first slant angle α1 is equal to about 10°, and the phase becomes small when the first slant angle α1 is equal to or less than about 2.5°. As in FIGS. 8 to 10, setting the first slant angle α1 of the series resonator 111s to be less than or equal to about 2.5° can make the impedance disturbance and the phase small and can significantly reduce or prevent generation of the stop band response.

Figure 11:
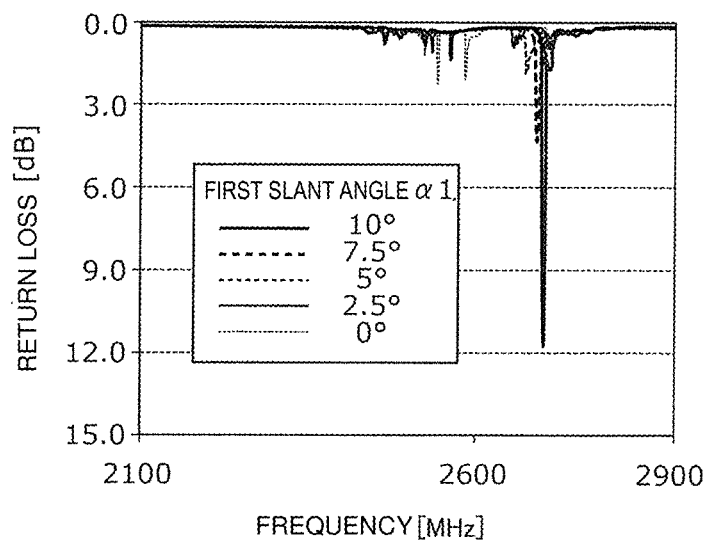
FIG. 11 is a diagram showing the return loss of the first filter according to Preferred Embodiment 1 of the present invention.

FIG. 11 is a diagram showing the return loss of the first filter 11. Specifically, FIG. 11 is a diagram showing the relationships between frequency and return loss for the first filter 11 when the first slant angle α1 of the series resonator 111s changes. The return loss refers to the ratio of the intensity of a signal output to the common terminal Port1 to the intensity of a signal input from the common terminal Port1 to the first filter 11. Lower return loss indicates larger reflection of a signal. The second slant angle α2 of the parallel resonator 111p, and the third slant angle α3 of the other acoustic wave resonators 112s to 114s, 112p, and 113p are set to satisfy the relationship of the first slant angle α1<the second slant angle α2 and the first slant angle α1<the third slant angle α3.

As shown in FIG. 11, in the first filter 11, the return loss is high at a frequency of about 2700 MHz, which is in the stop band. When observed for increments of the first slant angle α1, the return loss is high when the first slant angle α1 is equal to about 10°, with the return loss decreasing as the first slant angle α1 decreases stepwise. For example, when the first slant angle α1 is equal to or less than about 2.5°, substantially no return loss appears at a frequency of about 2700 MHz, which is in the stop band of the first filter 11.

As in FIG. 11, setting the first slant angle α1 to be less than or equal to about 2.5° under conditions where the first slant angle α1<the second slant angle α2 and the first slant angle α1<the third slant angle α3 can reduce or prevent the return loss of the first filter 11.

The multiplexer 1 according to Preferred Embodiment 1 includes the common terminal Port1, the first terminal Port11, the second terminal Port21, the first filter 11 provided on the first path r1 connecting the common terminal Port1 and the first terminal Port11, the first filter 11 including the plurality of acoustic wave resonators 111s to 114s and 111p to 113p, and the second filter 21 provided on the second path r2 connecting the common terminal Port1 and the second terminal Port21, the second filter 21 having a pass band that is higher in frequency than the first filter 11. The plurality of acoustic wave resonators include two or more series resonators (for example, the series resonators 111s to 114s) provided on the first path r1, and one or more parallel resonators (for example, the parallel resonators 111p to 113p) each provided on a path connecting one of the nodes n1 to n3 on the first path r1 and ground. The first series resonator 111s, which is the closest to the common terminal Port1 among the two or more series resonators 111s to 114s, is connected to the common terminal Port1 without the parallel resonators 111p to 113p therebetween. Each of the plurality of acoustic wave resonators includes the IDT electrode 32, which is defined by the pair of comb-shaped electrodes 32a and 32b formed on the substrate 320 having piezoelectricity. Each of the pair of comb-shaped electrodes 32a and 32b of each of the plurality of acoustic wave resonators includes the pluralities of electrode fingers 322a and 322b that extend in a direction perpendicular or substantially perpendicular to the acoustic wave propagation direction D1, and the busbar electrodes 321a and 321b that connect first ends of the pluralities of electrode fingers 322a and 322b to each other. The imaginary line L1 obtained by connecting the second ends e2 of the plurality of electrode fingers 322a included in a comb-shaped electrode (for example, the comb-shaped electrode 32a) among the pair of comb-shaped electrodes 32a and 32b to each other intersect the reference line L0, which is a straight line extending in the acoustic wave propagation direction D1. When an angle defined by the reference line L0 and the imaginary line L1 of the first series resonator 111s is represented by the first slant angle α1, an angle defined by the reference line L0 and the imaginary line L1 of the first parallel resonator 111p, which is the closest to the common terminal Port1 among the one or more parallel resonators 111p to 113p, is represented by the second slant angle α2, and an angle defined by the reference line L0 and the imaginary line L1 of the rest of the plurality of acoustic wave resonators 112s to 114s, 112p, and 113p is represented by the third slant angle α3, at least one of the first slant angle α1 and the second slant angle α2 is smaller than the third slant angle α3.

As described above, in each of the resonators 110 included in the first filter 11, the IDT electrode 32 is arranged such that the imaginary line L1 and the reference line L0 intersect, that is, the IDT electrode 32 is slanted relative to the acoustic wave propagation direction D1. This arrangement is able to significantly reduce or prevent generation of the transverse-mode ripple in each of the resonators 110. In addition, the IDT electrode 32 of the series resonator 111s, which is the closest to the common terminal Port1, is less slanted than the IDT electrodes 32 of the other acoustic wave resonators 112s to 114s and 111p to 113p. This arrangement is able to significantly reduce or prevent generation of the stop band response of the series resonator 111s, which largely affects the second filter 21. Therefore, it is possible to significantly reduce or prevent the stop band response of the first filter 11 and to reduce the insertion loss in the pass band of the second filter 21.

Modification 1 of Preferred Embodiment 1

In the multiplexer 1 according to Modification 1 of Preferred Embodiment 1, the parallel resonator that is the closest to the common terminal Port1 among one or more parallel resonators has a smaller slant angle than the subsequent resonator(s).

Figure 12:
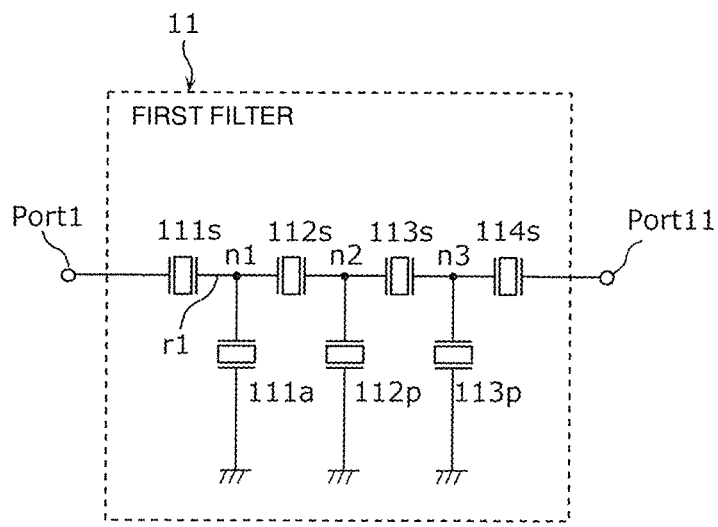
FIG. 12 is a circuit diagram of a first filter according to Modification 1 of Preferred Embodiment 1 of the present invention.

FIG. 12 is a circuit diagram of a first filter 11 according to Modification 1 of Preferred Embodiment 1. The first filter 11 according to Modification 1 includes a parallel resonator 111a in place of the parallel resonator 111p provided in Preferred Embodiment 1. The parallel resonator 111a is positioned closest to the common terminal Port1 among the plurality of parallel resonators 111a, 112p, and 113p.

Figure 13:
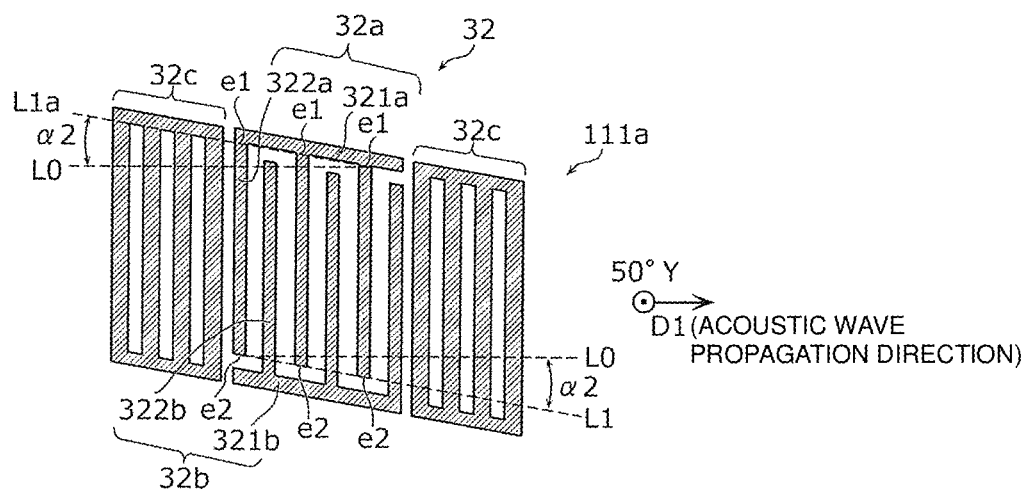
FIG. 13 is a plan view of a first parallel resonator that is the closest to the common terminal in the first filter of Modification 1 of Preferred Embodiment 1 of the present invention.

FIG. 13 is a plan view showing the parallel resonator 111a, which is the closest to the common terminal Port1 in the first filter 11 of Modification 1. In the first filter 11 of Modification 1, the parallel resonator 111a has a different slant angle from the other parallel resonators 112p and 113p, different from the parallel resonator 111a.

Specifically, as shown in FIG. 13, when the angle defined by the reference line L0 and the imaginary line L1 of the parallel resonator 111a is represented by a second slant angle $\alpha 2$, the relationship of the second slant angle $\alpha 2$<the third slant angle $\alpha 3$ is satisfied. The second slant angle $\alpha 2$ is selected as appropriate preferably from within a range greater than 0° and less than or equal to about 2.5°, for example. The second slant angle $\alpha 2$ may be the same or substantially the same angle as the first slant angle $\alpha 1$.

In the multiplexer 1 according to Modification 1, when the angle defined by the reference line L0 and the imaginary line L1 of the parallel resonator 111a, which is the closest to the common terminal Port1 among the one or more parallel resonators 111a, 112p, and 113p, is represented by a second slant angle $\alpha 2$, the second slant angle $\alpha 2$ is smaller than the third slant angle $\alpha 3$ described above. Among the parallel resonators 111a, 112p, and 113p defining the first filter 11, the parallel resonator 111a, which affects the second filter 21, has the features described above, thereby further significantly reducing or preventing the response in the stop band of the first filter 11.

Modification 2 of Preferred Embodiment 1

In the multiplexer 1 according to Modification 2 of Preferred Embodiment 1, the series resonator 111s of the first filter 11 is defined by separate resonators.

Figure 14:
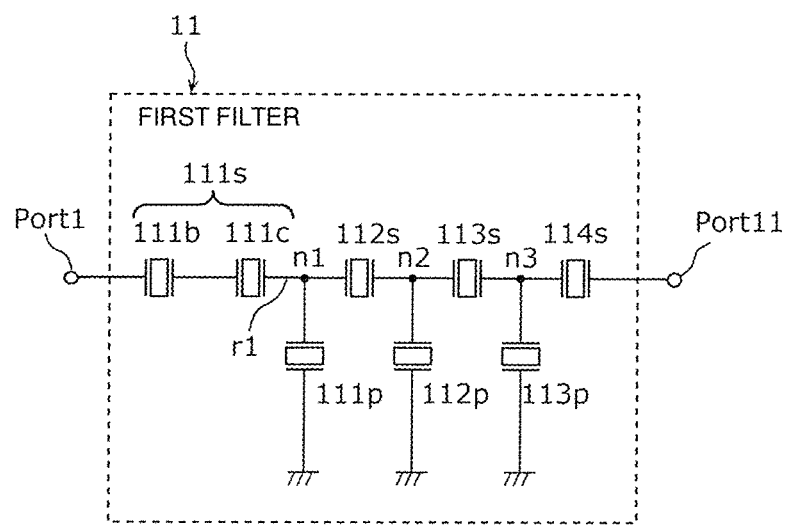
FIG. 14 is a circuit diagram of a first filter according to Modification 2 of Preferred Embodiment 1 of the present invention.

FIG. 14 is a circuit diagram of a first filter 11 according to Modification 2 of Preferred Embodiment 1. As shown in FIG. 14, in the multiplexer 1 according to Modification 2, the series resonator 111s of the first filter 11 is defined by two series resonators 111b and 111c, which are arranged in series. Among the series resonators 111b and 111c, the series resonator 111b, which is the closest to the common terminal Port1, has the first slant angle $\alpha 1$. The series resonator 111c positioned between the series resonator 111b and the node n1 also has the first slant angle $\alpha 1$.

In the multiplexer 1 according to Modification 2, the first slant angle $\alpha 1$ of the series resonators 111b and 111c of the series resonator 111s, which is the closest to the common terminal Port1, is set to be smaller than the third slant angle $\alpha 3$ of the acoustic wave resonators 112s to 114s, 112p, and 113p positioned subsequent to the node n1. This can significantly reduce or prevent the response generated in the stop band of the first filter 11.

Preferred Embodiment 2

The multiplexer 1 of Preferred Embodiment 2 of the present invention includes a first filter 11A having a n-type ladder filter structure, which is different from the first filter of Preferred Embodiment 1 having a T-type ladder filter structure.

Figure 15:
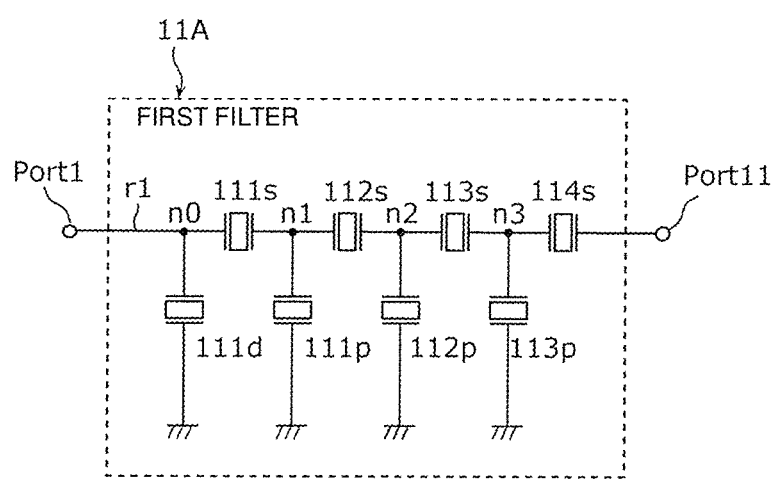
FIG. 15 is a circuit diagram of a first filter of the multiplexer according to Preferred Embodiment 2 of the present invention.

FIG. 15 is a circuit diagram of the first filter 11A of the multiplexer 1 according to Preferred Embodiment 2. As shown in FIG. 15, the first filter 11A includes series resonators 111s to 114s and parallel resonators 111d and 111p to 113p.

The series resonators 111s to 114s are provided on a first path (series arm) r1 connecting the common terminal Port1 and the first terminal Port11, and the series resonators 111s to 114s are connected in series with each other in the stated order from the common terminal Port1 side. The parallel resonators 111d and 111p to 113p include the parallel resonator (first parallel resonator) 111d positioned on the common terminal Port1 side, and the parallel resonators 111p to 113p positioned on the first terminal Port11 side, as seen from the series resonator (first series resonator) 111s, which is the closest to the common terminal Port1 among the series resonators 111s to 114s. The parallel resonator 111d is connected to a path (parallel arm) connecting a node n0 between the common terminal Port1 and the series resonator 111s and the reference terminal (ground). Specifically, the parallel resonator 111d, which is the closest to the common terminal Port1, is connected to the common terminal Port1 without the series resonators 111s to 114s therebetween. The parallel resonators 111p to 113p are provided on paths connecting the nodes n1, n2, and n3, each of which lies between adjacent ones of the series resonators 111s to 114s along the first path r1, and the reference terminal. Accordingly, the parallel resonators 111p to 113p are connected in parallel to each other.

The first filter 11A has a π-type ladder filter structure defined by one or more series resonators (for example, the four series resonators 111s to 114s) provided on the first path r1, and two or more parallel resonators (for example, the four parallel resonators 111d and 111p to 113p) provided on paths connecting the first path r1 and the reference terminal.

Figure 16A:
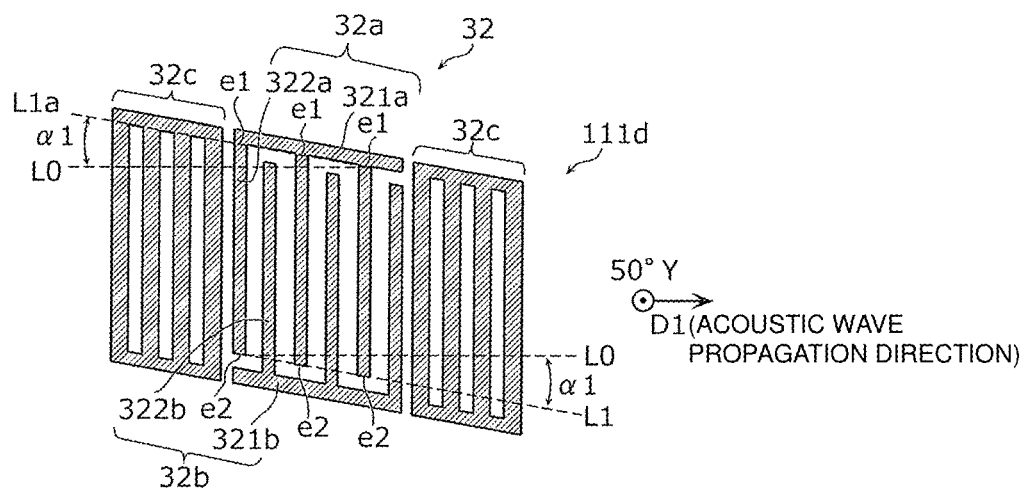
FIG. 16A is a plan view of a parallel resonator that is the closest to the common terminal in the first filter of Preferred Embodiment 2 of the present invention.
Figure 16B:
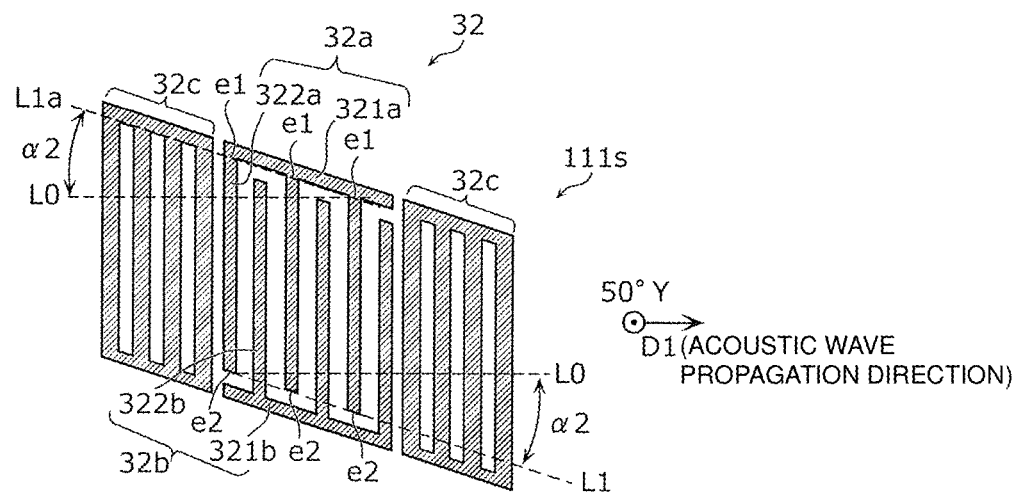
FIG. 16B is a plan view of a series resonator that is the closest to the common terminal in the first filter of Preferred Embodiment 2 of the present invention.
Figure 16C:
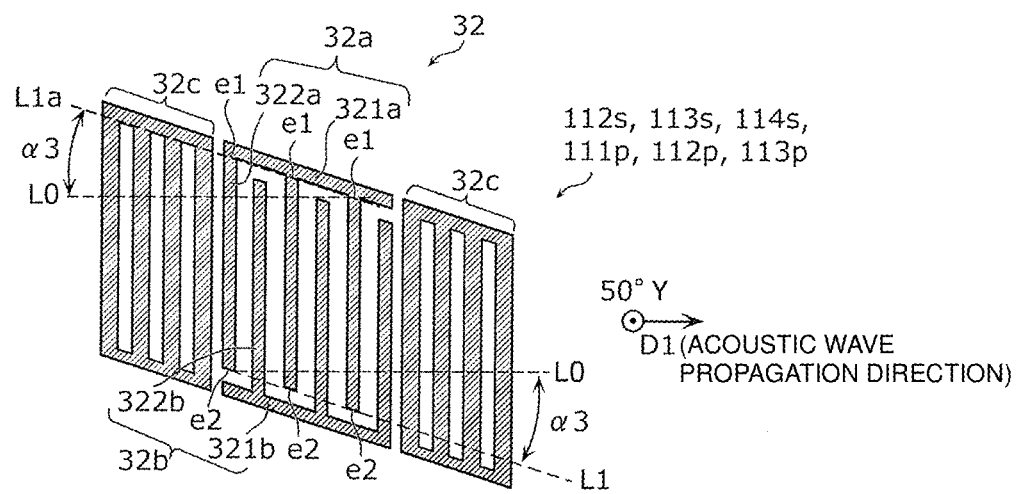
FIG. 16C is a plan view of the other acoustic wave resonators in the first filter of Preferred Embodiment 2 of the present invention.

FIG. 16A is a plan view showing the parallel resonator 111d, which is the closest to the common terminal Port1 in the first filter 11A. FIG. 16B is a plan view showing the series resonator 111s, which is the closest to the common terminal Port1 in the first filter 11A. FIG. 16C is a plan view showing the other acoustic wave resonators 112s to 114s and 111p to 113p, different from the parallel resonator 111d and the series resonator 111s and, in the first filter 11A.

As shown in FIGS. 16A and 16B, in the first filter 11A, the parallel resonator 111d and the series resonator 111s have different slant angles. As shown in FIGS. 16A and 16C, in the first filter 11A, the parallel resonator 111d has a different slant angle from the other acoustic wave resonators 112s to 114s and 111p to 113p.

Specifically, as shown in FIG. 16A, the angle defined by the reference line L0 and the imaginary line L1 of the parallel resonator 111d is represented by a first slant angle $\alpha 1$, as shown in FIG. 16B, the angle defined by the reference line L0 and the imaginary line L1 of the series resonator 111s is represented by a second slant angle $\alpha 2$, and, as shown in FIG. 16C, the angle defined by the reference line L0 and the imaginary line L1 of each of the other acoustic wave resonators 112s to 114s and 111p to 113p is represented by a third slant angle α3. In this case, the relationship of the first slant angle α1<the second slant angle α2 and the first slant angle α1<the third slant angle α3 is satisfied. The first slant angle α1 is selected as appropriate preferably from within a range greater than 0° and less than or equal to about 2.5°, for example. The resonators 110 defining the first filter 11A have the features described above, thereby significantly reducing or preventing the response generated in the stop band of the first filter 11A while significantly reducing or preventing generation of the transverse-mode ripple.

The respective third slant angles α3 of the acoustic wave resonators 112s to 114s and 111p to 113p may be the same or different.

In Preferred Embodiment 2 described above, only the parallel resonator 111d has the first slant angle α1, by way of example but not limitation. The series resonator 111s may also have a smaller slant angle than the third slant angle α3.

That is, when the angle defined by the reference line L0 and the imaginary line L1 of the series resonator 111s, which is the closest to the common terminal Port1 among one or more series resonators (for example, the series resonators 111s to 114s), is represented by a second slant angle α2, the second slant angle α2 may be smaller than the third slant angle α3. The second slant angle α2 is selected as appropriate preferably from within a range greater than 0° and less than or equal to about 2.5°, for example. The second slant angle α2 may be the same or substantially the same angle as the first slant angle α1. The series resonator 111s, which is the closest to the common terminal Port1 among the series resonators 111s to 114s defining the first filter 11A of Preferred Embodiment 2, has the features described above, thereby further significantly reducing or preventing the response generated in the stop band of the first filter 11A.

Modification 1 of Preferred Embodiment 2

In the multiplexer 1 according to Modification 1 of Preferred Embodiment 2, the parallel resonator 111d of the first filter 11A is defined by separate resonators.

Figure 17:
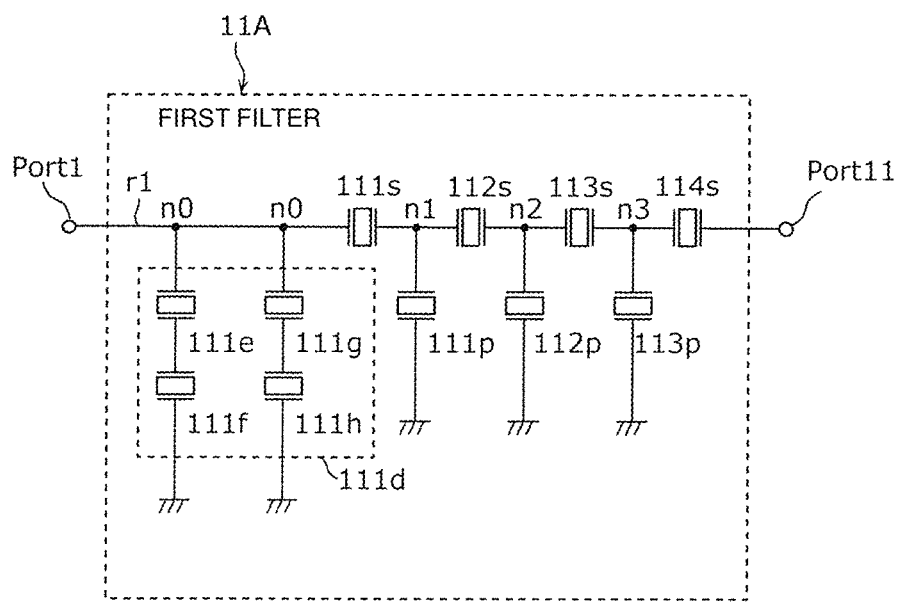
FIG. 17 is a circuit diagram of a first filter according to Modification 1 of Preferred Embodiment 2 of the present invention.

FIG. 17 is a circuit diagram of a first filter 11A according to Modification 1 of Preferred Embodiment 2. As shown in FIG. 17, the first filter 11A includes the series resonators 111s to 114s and the parallel resonators 111d and 111p to 113p. The parallel resonator 111d is defined by separate parallel resonators 111e, 111f, 111g, and 111h.

The parallel resonators 111e and 111f are connected in series with each other and are connected to a path connecting a node n0 between the common terminal Port1 and the series resonator 111s and the reference terminal. The parallel resonators 111g and 111h are connected in series with each other and are connected to a path connecting a node n0 between the common terminal Port1 and the series resonator 111s and the reference terminal. Specifically, the parallel resonators 111e and 111f, which are the closest to the common terminal Port1, are connected to the node n0 without the series resonators 111s to 114s therebetween. The parallel resonators 111g and 111h, which are the second closest to the common terminal Port1, are connected to the node n0 without the series resonators 111s to 114s therebetween.

The first filter 11A has a π-type ladder filter structure defined by one or more series resonators provided on the first path r1 and two or more parallel resonators (for example, the seven parallel resonators 111e to 111h and 111p to 113p) provided on paths connecting the first path r1 and the reference terminal.

In Modification 1 of Preferred Embodiment 2, when the angle defined by the reference line L0 and the imaginary line L1 of each of the parallel resonators 111e to 111h is represented by a first slant angle α1, and the angle defined by the reference line L0 and the imaginary line L1 of each of the acoustic wave resonators 112s to 114s and 111p to 113p is represented by a third slant angle α3, the relationship of the first slant angle α1<the third slant angle α3 is satisfied. The resonators 110 defining the first filter 11A has the features described above, thereby significantly reducing or preventing the response generated in the stop band of the first filter 11A.

Preferred Embodiment 3

The multiplexer according to Preferred Embodiments 1 and 2 described above and their modifications can be applied to a high-frequency front-end circuit and further to a communication device including the high-frequency front-end circuit. In Preferred Embodiment 3 of the present invention, the high-frequency front-end circuit and the communication device will be described.

Figure 18:
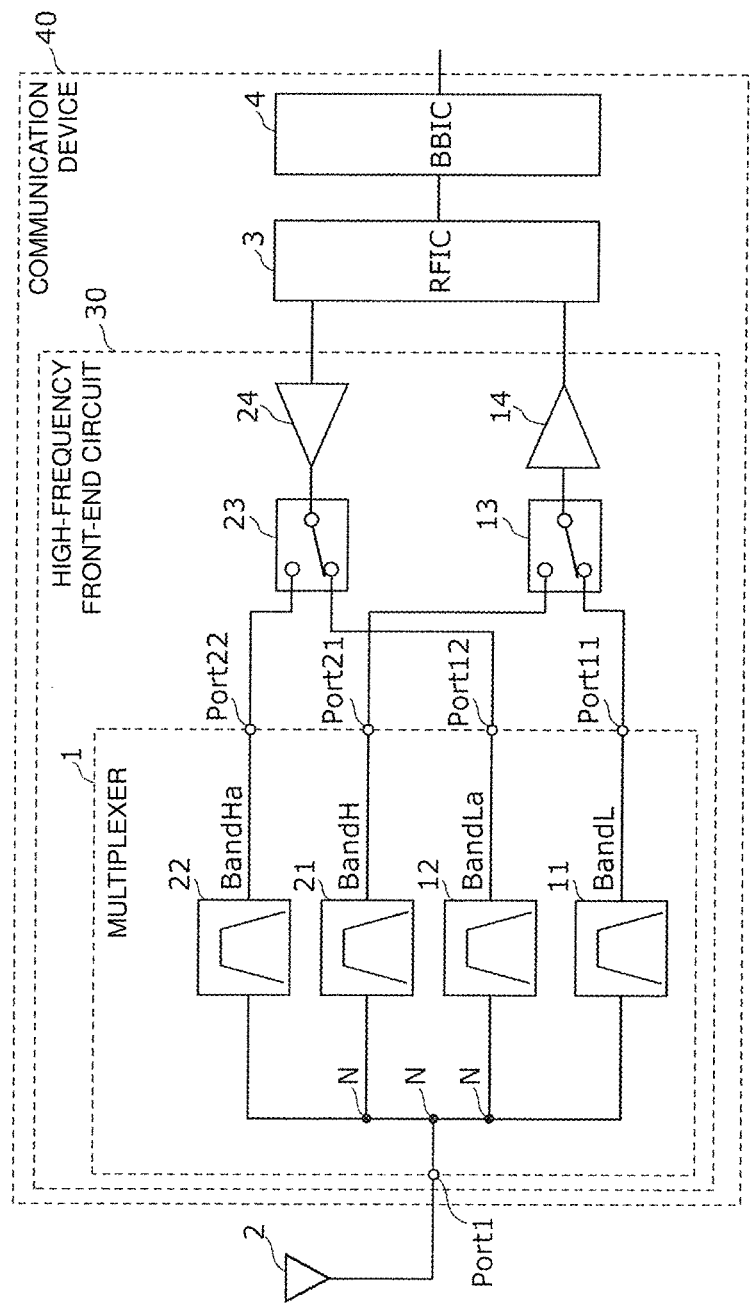
FIG. 18 is a diagram of a high-frequency front-end circuit according to Preferred Embodiment 3.

FIG. 18 is a diagram of a high-frequency front-end circuit 30 according to Preferred Embodiment 3. In FIG. 18, an antenna element 2, an RF signal processing circuit (RFIC) 3, and a baseband signal processing circuit (BBIC) 4, which are connected to the high-frequency front-end circuit 30, are also shown. The high-frequency front-end circuit 30, the RF signal processing circuit 3, and the baseband signal processing circuit 4 form a communication device 40.

The high-frequency front-end circuit 30 includes the multiplexer 1 according to Preferred Embodiment 1, a receive-side switch 13, a transmit-side switch 23, a low-noise amplifier circuit 14, and a power amplifier circuit 24.

The multiplexer 1 includes four filters. Specifically, the multiplexer 1 includes a filter 12 and a filter 22 in addition to the first filter 11 and the second filter 21. The filter 12 is a transmit filter whose pass band is the uplink frequency band (transmit band) and is provided on a path connecting the common terminal Port1 and an individual terminal Port12. The filter 22 is a transmit filter whose pass band is the uplink frequency band (transmit band) and is provided on a path connecting the common terminal Port1 and an individual terminal Port22.

The receive-side switch 13 is a switch circuit including two selection terminals individually connected to the first terminal Port11 and the second terminal Port21, which are output terminals of the multiplexer 1, and a common terminal connected to the low-noise amplifier circuit 14.

The transmit-side switch 23 is a switch circuit including two selection terminals individually connected to the individual terminals Port12 and Port22, which are input terminals of the multiplexer 1, and a common terminal connected to the power amplifier circuit 24.

The receive-side switch 13 and the transmit-side switch 23 are each preferably defined by, for example, a SPDT (Single Pole Double Throw) switch that connects the common terminal to a signal path corresponding to a predetermined band in accordance with a control signal from a control unit (not shown). The number of selection terminals to be connected to the common terminal is not limited to one, and a plurality of selection terminals may be connected to the common terminal. That is, the high-frequency front-end circuit 30 may support carrier aggregation.

The low-noise amplifier circuit 14 is a receive amplifier circuit that amplifies a high-frequency signal (here, a high-frequency receive signal) that has passed through the antenna element 2, the multiplexer 1, and the receive-side switch 13 and outputs the amplified signal to the RF signal processing circuit 3.

The power amplifier circuit 24 is a transmit amplifier circuit that amplifies a high-frequency signal (here, a high-frequency transmit signal) output from the RF signal processing circuit 3 and outputs the amplified signal to the antenna element 2 via the transmit-side switch 23 and the multiplexer 1.

The RF signal processing circuit 3 performs signal processing, for example, down-conversion, on a high-frequency receive signal input from the antenna element 2 via a receive signal path and outputs a receive signal generated through the signal processing to the baseband signal processing circuit 4. Further, the RF signal processing circuit 3 performs signal processing, for example, up-conversion, on a transmit signal input from the baseband signal processing circuit 4 and outputs a high-frequency transmit signal generated through the signal processing to the power amplifier circuit 24. The RF signal processing circuit 3 is an RFIC, for example.

The signal processed by the baseband signal processing circuit 4 is, for example, an image signal to be used to display an image, or an audio signal to be used for the telephone conversation.

The high-frequency front-end circuit 30 may include any other suitable circuit element between the components described above.

The high-frequency front-end circuit 30 and the communication device 40 having the features described above include the multiplexer 1 according to Preferred Embodiment 1 described above. This can significantly reduce or prevent the stop band response generated outside the pass band of the first filter 11 and reduce the insertion loss in the pass band of the second filter 21.

The high-frequency front-end circuit 30 may include, in place of the first filter 11 of the multiplexer 1 according to Preferred Embodiment 1, the first filter 11 of Modification 1 of Preferred Embodiment 1 or the first filter 11A according to Preferred Embodiment 2 and Modification 1 of Preferred Embodiment 2.

The communication device 40 may not include the baseband signal processing circuit 4 depending on the method for processing a high-frequency signal.

OTHER PREFERRED EMBODIMENTS

A multiplexer, a high-frequency front-end circuit, and a communication device according to preferred embodiments of the present invention have been described with reference to preferred embodiments and their modifications. The present invention may be carried out in other preferred embodiments implemented by combining any of the components in the preferred embodiments and modifications described above or in modifications obtained by making various modifications conceived of by a person skilled in the art to the preferred embodiments described above without departing from the spirit of the present invention. Such other preferred embodiments, modifications, and various devices including a high-frequency front-end circuit and a communication device according to the present invention are also included in the present invention.

For example, Preferred Embodiment 3 described above describes a multiplexer including four filters, by way of example. However, the present invention is also applicable to, for example, a triplexer in which antenna terminals of three filters are shared, or a hexaplexer in which antenna terminals of six filters are shared. That is, a multiplexer preferably includes, for example, two or more filters.

Further, Preferred Embodiment 1 described above provides an example in which both the first filter and the second filter are receive filters. However, the present invention is applicable to a multiplexer in which the stop band response of a first filter lies in the pass band of a second filter, regardless of the specific implementation or application of the first and second filters and the like. Accordingly, at least one of the first and second filters may be a receive filter. The multiplexer may not include both a transmit filter and a receive filter, and may include only a transmit filter or only a receive filter.

Further, Preferred Embodiment 1 described above provides a non-limiting example in which each of the resonators 110 does not include offset electrode fingers (electrodes that protrude from busbar electrodes on opposite sides and face electrode fingers). Each resonator may include offset electrode fingers.

Further, the materials of the close-contact layer 324, the main electrode layer 325, and the protection layer 326 of the IDT electrode 32 and the reflectors 32c are not limited to the materials described above. In addition, the IDT electrode 32 may not have the multilayer structure described above. The IDT electrode 32 may be made of a metal such as Ti, Al, Cu, Pt, Au, Ag, or Pd or an alloy of these metals, for example, or may be formed of a plurality of multilayer bodies including such metals or alloys, for example. The protection layer 326 may not be provided.

Further, in the substrate 320 of the acoustic wave resonator 110 of Preferred Embodiment 1, the high-acoustic-velocity support substrate 329 may have a structure in which a support substrate and a high-acoustic-velocity film in which a bulk wave propagates at a higher acoustic velocity than that of a surface acoustic wave or a boundary acoustic wave that propagates in the piezoelectric layer 327 are stacked on each other.

Further, Preferred Embodiment 1 provides an example in which the IDT electrodes 32 defining the first filter 11 are provided on the substrate 320 including the piezoelectric layer 327. However, the substrate on which the IDT electrodes 32 are provided may be a piezoelectric substrate including the piezoelectric layer 327 as a single layer. In this case, the piezoelectric substrate is preferably made of, for example, a $LiTaO_3$ piezoelectric single crystal or any other piezoelectric single crystal such as $LiNbO_3$. The substrate 320 on which the IDT electrodes 32 are provided may include any structure having piezoelectricity in which a piezoelectric layer is stacked on top of a support substrate, other than a structure that is entirely formed of a piezoelectric layer.

Further, the piezoelectric layer 327 according to Preferred Embodiment 1 described above includes a 50° Y-cut X-propagation $LiTaO_3$ single crystal. However, the cut angle of the single crystal material is not limited to this. That is, the multilayer structure, the material, and the thickness may be changed in accordance with the predetermined bandpass characteristics and the like of the acoustic wave filter device, and a surface acoustic wave filter that includes a $LiTaO_3$ piezoelectric substrate having a different cut angle from that described above, a $LiNbO_3$ piezoelectric substrate, or the like can also achieve similar advantageous effects.

Preferred embodiments of the present invention provide multiplexers, front-end circuits, and communication devices, which are each applicable to a multiband system, and can be widely implemented in communication equipment, for example, mobile phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a common terminal, a first terminal, and a second terminal;
   a first filter provided on a first path electrically connecting the common terminal and the first terminal, the first filter including a plurality of acoustic wave resonators; and
   a second filter provided on a second path electrically connecting the common terminal and the second terminal, the second filter having a pass band that is higher in frequency than the first filter; wherein
   the plurality of acoustic wave resonators include:
      two or more series resonators provided on the first path; and
      one or more parallel resonators each provided on a path electrically connecting a node on the first path and ground;
   a first series resonator that is closest to the common terminal among the two or more series resonators is electrically connected to the common terminal without the one or more parallel resonators therebetween;
   each of the plurality of acoustic wave resonators includes an interdigital transducer (IDT) electrode defined by a pair of comb-shaped electrodes provided on a substrate having piezoelectricity;
   each of the pair of comb-shaped electrodes of each of the plurality of acoustic wave resonators includes:
      a plurality of electrode fingers that extend in a direction perpendicular or substantially perpendicular to an acoustic wave propagation direction; and
      a bulbar electrode that connects first ends of the plurality of electrode fingers to each other;
   an imaginary line obtained by connecting second ends of the plurality of electrode fingers included in one comb-shaped electrode among the pair of comb-shaped electrodes intersects a reference line that is a straight line extending in the acoustic wave propagation direction; and
   when an angle defined by the reference line and the imaginary line of the first series resonator is represented by a first slant angle, an angle defined by the reference line and the imaginary line of a first parallel resonator that is closest to the common terminal among the one or more parallel resonators is represented by a second slant angle, and an angle defined by the reference line and the imaginary line of the rest of the plurality of acoustic wave resonators is represented by a third slant angle, at least one of the first slant angle and the second slant angle is smaller than the third slant angle.

2. The multiplexer according to claim 1, wherein at least one of the first slant angle and the second slant angle is less than or equal to about 2.5°.

3. The multiplexer according to claim 1, wherein each of the first slant angle and the second slant angle is smaller than the third slant angle.

4. The multiplexer according to claim 1, wherein the substrate includes:
   a piezoelectric layer including a principal surface on which the IDT electrodes are provided;
   a high-acoustic-velocity support substrate in which a bulk wave propagates at a higher acoustic velocity than an acoustic velocity of an acoustic wave that propagates in the piezoelectric layer; and
   a low-acoustic-velocity film that is located between the high-acoustic-velocity support substrate and the piezoelectric layer and in which a bulk wave propagates at a lower acoustic velocity than an acoustic velocity of a bulk wave that propagates in the piezoelectric layer.

5. The multiplexer according to claim 4, wherein the piezoelectric layer has a thickness that is less than or equal to about $3.5\lambda$, where $\lambda$ is a wave length of an acoustic wave determined by an electrode pitch of the IDT electrode.

6. The multiplexer according to claim 4, wherein the low-acoustic-velocity film has a thickness that is less than or equal to about $2\lambda$, where $\lambda$ is a wave length of an acoustic wave determined by an electrode pitch of the IDT electrode.

7. The multiplexer according to claim 1, wherein the second filter does not include a resonator.

8. The multiplexer according to claim 1, wherein a frequency of a stop band response generated by the first filter is included in the frequency pass band of the second filter.

9. A high-frequency front-end circuit comprising:
   the multiplexer according to claim 1; and
   an amplifier circuit electrically connected to the multiplexer.

10. A communication device comprising:
    an RF signal processing circuit that processes a high-frequency signal to be transmitted or received by an antenna element; and
    the high-frequency front-end circuit according to claim 9; wherein
    the high-frequency front-end circuit transmits the high-frequency signal between the antenna element and the RF signal processing circuit.

11. The multiplexer according to claim 1, wherein each of the pair of comb-shaped electrodes of each of the IDT electrodes is located between a pair of parallel reflection electrode fingers.

12. The multiplexer according to claim 1, wherein each of the pair of comb-shaped electrodes includes a multilayer structure of a close-contact layer and a main electrode layer.

13. The multiplexer according to claim 1, wherein the two or more series resonators and the one or more parallel resonators define a ladder filter.

14. The multiplexer according to claim 1, wherein the acoustic wave resonators are surface acoustic wave resonators.

15. The multiplexer according to claim 1, wherein the second filter is a ladder filter or a longitudinally-coupled filter.

16. A multiplexer comprising:
    a common terminal, a first terminal, and a second terminal;
    a first filter provided on a first path electrically connecting the common terminal and the first terminal, the first filter including a plurality of acoustic wave resonators; and
    a second filter provided on a second path electrically connecting the common terminal and the second terminal, the second filter having a pass band that is higher in frequency than the first filter; wherein
    the plurality of acoustic wave resonators include:
       one or more series resonators provided on the first path; and
       two or more parallel resonators provided on paths electrically connecting the first path and ground, the two or more parallel resonators include a first parallel resonator positioned on the common terminal side, and a parallel resonator positioned on the first terminal side, as viewed from a first series resonator that is closest to the common terminal among the one or more series resonators;

each of the plurality of acoustic wave resonators includes an IDT electrode defined by a pair of comb-shaped electrodes provided on a substrate having piezoelectricity;

each of the pair of comb-shaped electrodes of each of the plurality of acoustic wave resonators includes:
 a plurality of electrode fingers that extend in a direction perpendicular or substantially perpendicular to an acoustic wave propagation direction; and
 a bulbar electrode that connects first ends of the plurality of electrode fingers to each other;

an imaginary line obtained by connecting second ends of the plurality of electrode fingers included in one comb-shaped electrode among the pair of comb-shaped electrodes intersects a reference line that is a straight line extending in the acoustic wave propagation direction; and when an angle defined by the reference line and the imaginary line of the first parallel resonator is represented by a first slant angle, an angle defined by the reference line and the imaginary line of the first series resonator is represented by a second slant angle, and an angle defined by the reference line and the imaginary line of the rest of the plurality of acoustic wave resonators is represented by a third slant angle, at least one of the first slant angle and the second slant angle is smaller than the third slant angle.

17. The multiplexer according to claim 16, wherein at least one of the first slant angle and the second slant angle is less than or equal to about 2.5°.

18. The multiplexer according to claim 16, wherein each of the first slant angle and the second slant angle is smaller than the third slant angle.

19. A high-frequency front-end circuit comprising:
 the multiplexer according to claim 16; and
 an amplifier circuit electrically connected to the multiplexer.

20. A communication device comprising:
 an RF signal processing circuit that processes a high-frequency signal to be transmitted or received by an antenna element; and
 the high-frequency front-end circuit according to claim 19; wherein
 the high-frequency front-end circuit transmits the high-frequency signal between the antenna element and the RF signal processing circuit.

* * * * *